United States Patent
Shi et al.

(10) Patent No.: US 10,447,435 B2
(45) Date of Patent: Oct. 15, 2019

(54) REDUCED-STAGE POLAR DECODING

(71) Applicants: Wuxian Shi, Kanata (CA); Yiqun Ge, Kanata (CA)

(72) Inventors: Wuxian Shi, Kanata (CA); Yiqun Ge, Kanata (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/651,390

(22) Filed: Jul. 17, 2017

(65) Prior Publication Data

US 2018/0054278 A1  Feb. 22, 2018

Related U.S. Application Data

(60) Provisional application No. 62/376,992, filed on Aug. 19, 2016.

(51) Int. Cl.
| | |
|---|---|
| *H04L 1/00* | (2006.01) |
| *H03M 13/45* | (2006.01) |
| *H03M 13/13* | (2006.01) |
| *H03M 13/00* | (2006.01) |
| *H04W 88/02* | (2009.01) |
| *H04W 88/08* | (2009.01) |

(52) U.S. Cl.
CPC .......... *H04L 1/0058* (2013.01); *H03M 13/13* (2013.01); *H03M 13/45* (2013.01); *H03M 13/6502* (2013.01); *H03M 13/6505* (2013.01); *H04L 1/0045* (2013.01); *H04L 1/0052* (2013.01); *H04W 88/02* (2013.01); *H04W 88/08* (2013.01)

(58) Field of Classification Search
CPC .... H04L 1/0058; H04L 1/0045; H03M 13/45; H04W 88/08; H04W 88/02
See application file for complete search history.

(56) References Cited

U.S. PATENT DOCUMENTS

2015/0091742 A1 * 4/2015 Ionita ................... H03M 5/18
341/57
2015/0256196 A1  9/2015 Alhussien et al.

FOREIGN PATENT DOCUMENTS

| CN | 104124979 A | 10/2014 |
|---|---|---|
| CN | 105049061 A | 11/2015 |
| EP | 2953307 A1 | 12/2015 |

OTHER PUBLICATIONS

Bin Li, Hui Shen, David Tse, Wen Tong, "Low-latency polar codes via hybrid decoding", 8th International Symposium on Turbo Codes and Iterative Information Processing (ISTC), Aug. 18-22, 2014.
Sarkis et al., "Fast Polar Decoders: Algorithm and Implementation", IEEE Journal on Selected Areas in Communications, vol. 32, No. 5, May 2014, pp. 946-957.

(Continued)

*Primary Examiner* — Thien Nguyen

(57) ABSTRACT

In reduced-stage polar decoding, a received word that is based on an N-bit codeword of a polar code is decoded using fewer than $\log_2 N$ Log Likelihood Ratio (LLR) stages. Decoding uses a reduced stage decoding configuration. In an embodiment, such a configuration includes at least one higher-order LLR stage with nodes implementing functions that are based on a combination of lower-order polar code kernels.

16 Claims, 14 Drawing Sheets

$$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix} \quad G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix} \quad G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

(56) References Cited

OTHER PUBLICATIONS

E. Arikan, "Channel polarization: A method for constructing capacity-achieving codes for symmetric binary-input memoryless channels," IEEE Trans. Inf. Theory, vol. 55, No. 7, pp. 3051-3073, 2009.

Tal and Vardy, "List Decoding of Polar Codes", Proceedings of the 2011 IEEE International Symposium on Information Theory, pp. 1-5 (Jul. 2011).

Mori R, Tanaka T., "Performance and construction of polar codes on symmetric binary-input memoryless channels", IEEE International Symposium on Information Theory, 2009, 1496-1500.

P. Trifonov, "Efficient design and decoding of polar codes", IEEE Trans. on Communications 60.11 (2012): 3221-3227.

R1-1611254, "Details of the Polar Code Design", Huawei & HiSilicon, 3GPP TSG RAN WG1 Meeting #87, 2016.

3GPP TSG RAN WG1 NR Ad-Hoc Meeting #2 R1-1710842,"A flexible, low-latency, hardware-efficient SCL polar decoder",AccelerComm,Jun. 27-30, 2017,total 8 pages.

3GPP TSG RAN WG1 Meeting #84bis R1-162161,"Overview of Polar Codes",Huawei, HiSilicon,Apr. 11-15, 2016,total 7 pages.

3GPP TSG RAN WG1 Meeting #86 R1-167213,"Computational and implementation complexity of channel coding schemes",Huawei, HiSilicon,Aug. 22-26, 2016,total 6 pages.

Jin Sha et al.,"A memory efficient belief propagation decoder for polar codes", China Communications ( vol. 12 , Issue: 5 , May 2015 ), total 8 pages.

Bin Li et al.,"Parallel Decoders of Polar Codes", Sep. 4, 2013,https://arxiv.org/abs/1309.1026, total 4 pages.

Zhenzhen Liu et al.,"Performance analysis of polar codes based on 3×3 kernel matrix", 2015 10th International Conference on Communications and Networking in China (ChinaCom), total 6 pages.

Sinan Kahraman et al.,"Folded successive cancelation decoding of polar codes", 2014 Australian Communications Theory Workshop (AusCTW), total 6 pages.

Xianbin Wang et al.,"On the SC Decoder for Any Polar Code of Length N=ln",IEEE WCNC"14 Track 1 (PHY and Fundamentals), Apr. 6, 2014, total 6 pages.

* cited by examiner $$G_2 = \begin{bmatrix} 1 & 0 \\ 1 & 1 \end{bmatrix}$$

$100$ $$G_2^{\otimes 2} = \begin{bmatrix} G_2 & 0 \\ G_2 & G_2 \end{bmatrix} \quad G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}$$

$102$ $$G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

$104$

FIG. 1 f function : llr0' = sgn(llr0)*sgn(llr1)*min(abs(llr0),abs(llr1))
g function : llr1' = llr1+llr0 if in = 0
            llr1' = llr1-llr0 if in = 1

REDUCED-STAGE POLAR DECODING

CROSS-REFERENCE TO RELATED APPLICATIONS

The present application claims the benefit of U.S. Provisional Application No. 62/376,992, entitled "Reduced-Stage Polar Coding", filed on Aug. 19, 2016, the entire contents of which are incorporated herein by reference.

FIELD

The present disclosure relates to generally to communications and, in particular, to decoding of polar codes.

BACKGROUND

Polar codes are proposed as new channel codes for wireless communications, and have been selected for uplink and downlink enhanced Mobile Broadband (eMBB) control channel coding for the new $5^{th}$ Generation (5G) air interface, also known as the 5G New Radio (NR). These codes are competitive with state-of-the-art error correction codes and have low encoding complexity. See E. Arikan, "Channel polarization: A method for constructing capacity-achieving codes for symmetric binary-input memoryless channels," IEEE Trans. Inf. Theory, vol. 55, no. 7, pp. 3051-3073, 2009. Successive Cancellation (SC) and its extensions (e.g., SC List (SCL) decoding) are effective and efficient options for decoding polar coded N-bit codewords in $\log_2 N$ decoding stages.

Based on channel polarization, Arikan designed a channel code that is proven to reach channel capacity. Polarization refers to a coding property that, as code length increases to infinity, bit-channels also referred to as sub-channels polarize and their capacities approach either zero (completely noisy channel) or one (completely perfect channel). In other words, bits encoded in high capacity sub-channels will experience a channel with high Signal-to-Noise Ratio (SNR), and will have a relatively high reliability or a high likelihood of being correctly decoded, and bits encoded in low capacity sub-channels will experience a channel with low SNR, and will have low reliability or a low possibility to be correctly decoded. The fraction of perfect sub-channels is equal to the capacity of a channel.

SUMMARY

Illustrative embodiments are disclosed by way of example in the description and claims.

A method involves receiving a word that is based on an N-bit codeword of a polar code; and decoding the received word using fewer than $\log_2 N$ Log Likelihood Ratio (LLR) stages.

In an embodiment, a non-transitory processor-readable medium stores instructions which, when executed by one or more processors, cause the one or more processors to perform such a method.

An apparatus includes a receiver for receiving a word that is based on an N-bit codeword of a polar code; and a decoder, coupled to the receiver, to decode the received word in fewer than $\log_2 N$ Log Likelihood Ratio (LLR) stages.

Other aspects and features of embodiments of the present disclosure will become apparent to those ordinarily skilled in the art upon review of the following description.

BRIEF DESCRIPTION OF THE DRAWINGS

Examples of embodiments of the invention will now be described in greater detail with reference to the accompanying drawings.

FIG. 1 is a diagram showing how larger-dimension polar coding generator matrices can be produced from smaller-dimension generator matrices.

DETAILED DESCRIPTION

FIG. 1 is a diagram showing, by way of an illustrative example, how larger-dimension polar coding generator matrices can be produced from smaller-dimension generator matrices. Note that FIG. 1 is an example. Other forms of kernel are also possible.

A polar code can be formed from a Kronecker product matrix based on a seed matrix $F=G_2$ 100. For a polar code having codewords of length $N=2^m$, the generator matrix is $G_2^{\otimes m}$. In FIG. 1, the 2-fold Kronecker product matrix $G_2^{\otimes 2}$ 102 and the 3-fold Kronecker product matrix $G_2^{\otimes 3}$ 104 are examples of polar coding generator matrices produced from the 2-by-2 matrix $G_2$ 100. The generator matrix approach illustrated in FIG. 1 can be expanded to produce an m-fold Kronecker product matrix $G_2^{\otimes m}$.

Figure 2:
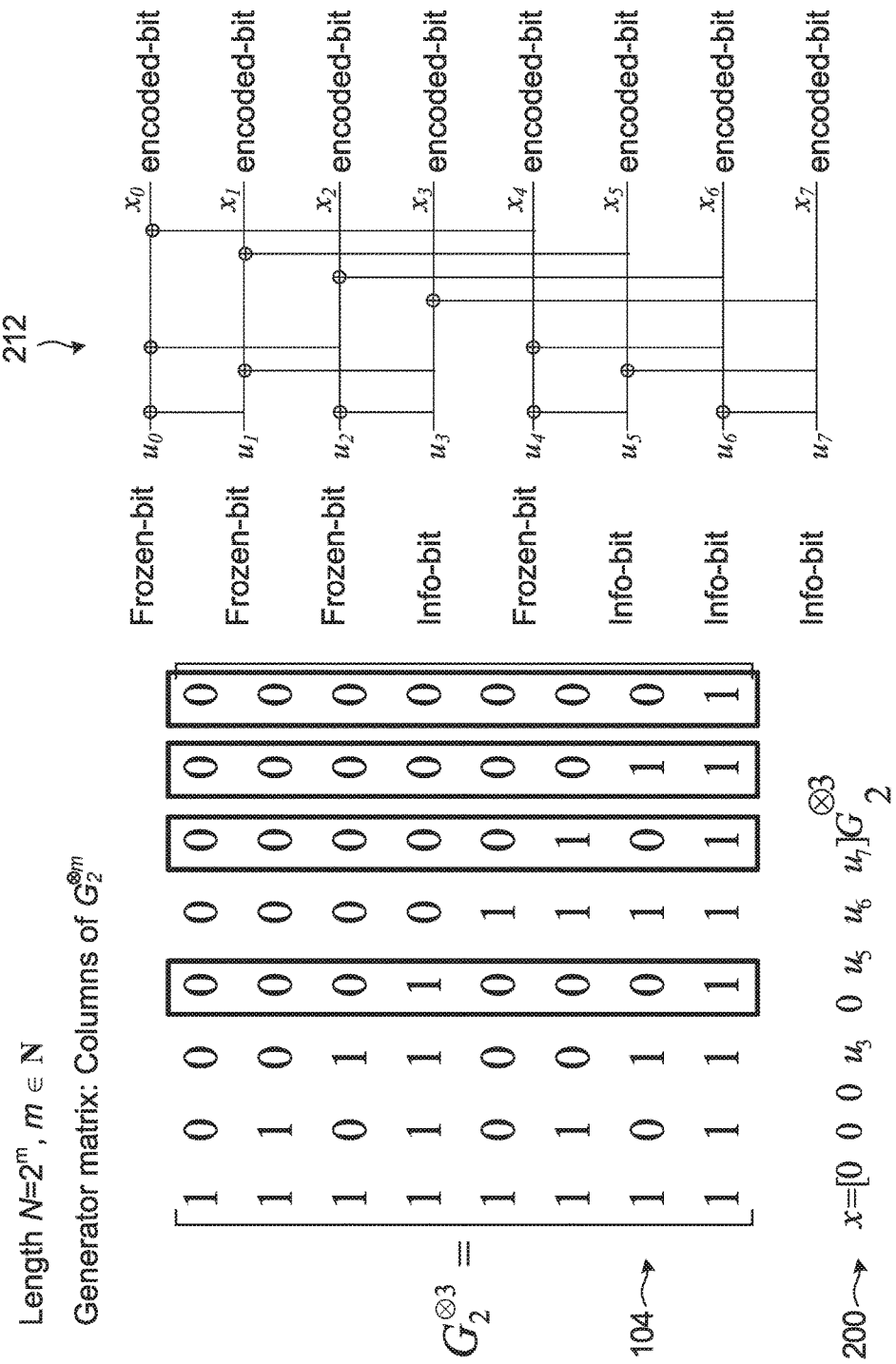
FIG. 2 is a diagram showing an example use of a polar coding generator matrix for producing codewords and a schematic illustration of an example polar encoder.

FIG. 2 is a diagram showing an example use of a polar coding generator matrix for producing codewords and a schematic illustration of an example polar encoder. In FIG. 2, the generator matrix $G_2^{\otimes 3}$ 104 is used to produce codewords of length $2^3=8$. A codeword x is formed by the product of an input vector u=[0 0 0 $u_3$ 0 $u_5$ $u_6$ $u_7$] and the generator matrix $G_2^{\otimes 3}$ 104 as indicated at 200. The input vector u is composed of information bits and fixed or frozen bits. In the specific example shown in FIG. 2, N=8, so the input vector u is an 8-bit vector, and the codeword x is an 8-bit vector. The input vector has frozen bits in positions 0, 1, 2 and 4, and has information bits at positions 3, 5, 6, and 7. An example implementation of an encoder that generates codewords is indicated at 212, where the frozen bits are all set to 0, and the circled "+" symbols represent modulo 2 addition. For the example of FIG. 2, an N=8-bit input vector is formed from K=4 information bits and N−K=4 frozen bits. Codes of this form are referred to as polar codes and the encoder is referred to as a polar encoder. Decoders for decoding polar codes are referred to as polar decoders. Frozen bits are set to zero in the example shown in FIG. 2. However, frozen bits could be set to other bit values that are known to both an encoder and a decoder. For ease of description, all-zero frozen bits are considered herein, and may be generally preferred.

As is known, polar coding may be performed with or without bit reversal. The example polar encoder in FIG. 2 is without bit reversal.

Generally, the output of a polar encoder can be expressed as $x_0^{N-1}=u_0^{N-1}G_N$, where, without bit reversal, $G_N=F^{\otimes n}$ is an N-by-N generator matrix, N=$2^n$, n≥1 (e.g. for n=1, $G_2$=F (indicated as 100 in FIG. 1)). For bit reversal, $G_N=B_N F^{\otimes n}$, where $B_N$ is an N-by-N bit-reversal permutation matrix.

Embodiments disclosed herein could be implemented without or with bit reversal.

In polar code construction, ideally the more "reliable" positions of an input vector are used to carry the information bits, and the more "unreliable" positions of an input vector are used to carry the frozen bits (i.e., bits already known to both encoder and decoder). However, when information is transmitted over a physical channel, the reliability of a given bit position is also a function of the characteristics of the physical channel, such as the erasure rate or the Signal-to-Noise Ratio (SNR) of the physical channel. A reliability sequence (reliable and unreliable positions) could be calculated based on assumed or measured characteristics of the physical channel before the information is transmitted over the channel, for example. In theory, the frozen bits can be set to any value as long as the location and value of each frozen bit is known to both the encoder and the decoder. In conventional applications, the frozen bits are all set to zero.

With a sufficiently long code length, a code designed according to polarization theory can reach the channel capacity in a binary symmetric memoryless channel if a Successive Cancellation (SC) based decoding algorithm is used. A very simple SC decoding algorithm was analyzed and simulated by Arikan.

In practice, a code length cannot be infinite and a channel cannot be a binary memoryless channel, and therefore channel capacity cannot be reached by such a simple SC decoder. According to Arikan, the channel capacity can be approached when using SC decoding if a code length is over $2^{20}$ bits in an AWGN channel. Such a long code length is impractical in wireless communications, for example.

Assistant or error-detecting code (EDC) bits can be included in the input vector to assist in decoding. A cyclic redundancy check (CRC) code could be used as an EDC. More than one EDC could be used within one codeword. However, it should be understood that other EDCs, such as a checksum code or a Fletcher Code, may be used. Some EDCs are also error-correcting codes (ECCs).

CRC bits, for example, are generated based on the information bits being transmitted. CRC bits are generally placed in more reliable positions in the input vector, although CRC bits may also or instead be placed in other positions in the input vector. CRC bits may be used in path selection for List decoding, for example, to improve polar code performance, or to detect whether one codeword is decoded correctly during or after the decoding. During encoding, an N-bit input vector could be formed from K information bits including one or more CRC bits, and (N−K) frozen bits. In this example, starting with a number of input bits, a CRC is calculated and appended to the input bits to produce a set of K information bits including the input bits and the CRC bits. The remaining (N−K) frozen bits are inserted to produce an N-bit input vector, where N is a power of 2 in an Arikan polar code. The input vector is then multiplied by a generator matrix for a polar code to produce an N-bit codeword.

The codeword is transmitted over a channel, and a receiver, in turn, receives a word. Due to channel effects such as noise, the received word might not be identical to the transmitted codeword. A decoder attempts to decode the received word to determine information bits in the original input vector.

During decoding of a codeword encoded from an input vector, the locations and values of frozen bits in the input vector are treated as known. For descriptive simplicity, bits of the input vector that are not known to the decoder in advance will be referred to as "unknown" bits. For example, the information bits including any CRC bits are unknown bits. Some polar decoders use SC decoding as noted above, in which the unknown bits are decoded sequentially and successive cancellation is applied. Once a particular decision has been made regarding how an unknown bit is to be decoded, SC polar decoders do not allow that bit to be changed or corrected, and the decoder moves on to decoding the next unknown bit.

An extension of SC polar decoding algorithm with better error correction performance, referred to as List or SCL decoding, is described in "List Decoding of Polar Codes" by Tal and Vardy, *Proceedings of the* 2011 *IEEE International Symposium on Information Theory*, pp. 1-5 (July 2011). In a List decoder, successive levels of a binary decision tree are generated, each level corresponding to a decision on a respective unknown bit. Each (decoding) path in the decision tree from the root node to leaf nodes represents a possible partial decoded sequence of unknown bits and has a corresponding likelihood. Typically, during generation of the decision tree, at each level of the decision tree where the number of paths grows beyond a set threshold L, the L paths having the highest likelihoods are identified, and the remaining paths are discarded. Some List decoders may also make use of CRC bits included in the codeword to assist in decoding. For example, if the codeword includes encoded CRC bits for the previous information bits, then once the decision tree is generated, each of the surviving paths that corresponds to decoded information bits is checked against the CRC bits represented in each of those surviving paths. The decoder then outputs as a decoded vector the information bits in the surviving path that passes the CRC check. If more than one path passes the CRC check, then the decoder selects for output the path that passes the CRC check and has the highest likelihood, which may be determined according to a metric. If no path passes the CRC check, or if the codeword does not include encoded CRC bits, then the decoder selects for output the path that has the highest likelihood, which as noted above may be determined according to a metric.

Thus, there are two types of the decoding based on successive cancellation: SC decoding and List decoding. SC decoding is a special case of SCL decoding, with list size L=1. An SC decoder tracks only one decoding path. After the value of a decoded bit is estimated, the other possible value is ignored. Decoding continues with the next bit, assuming that each previous bit has been correctly estimated when updating partial sum results.

Figure 3:
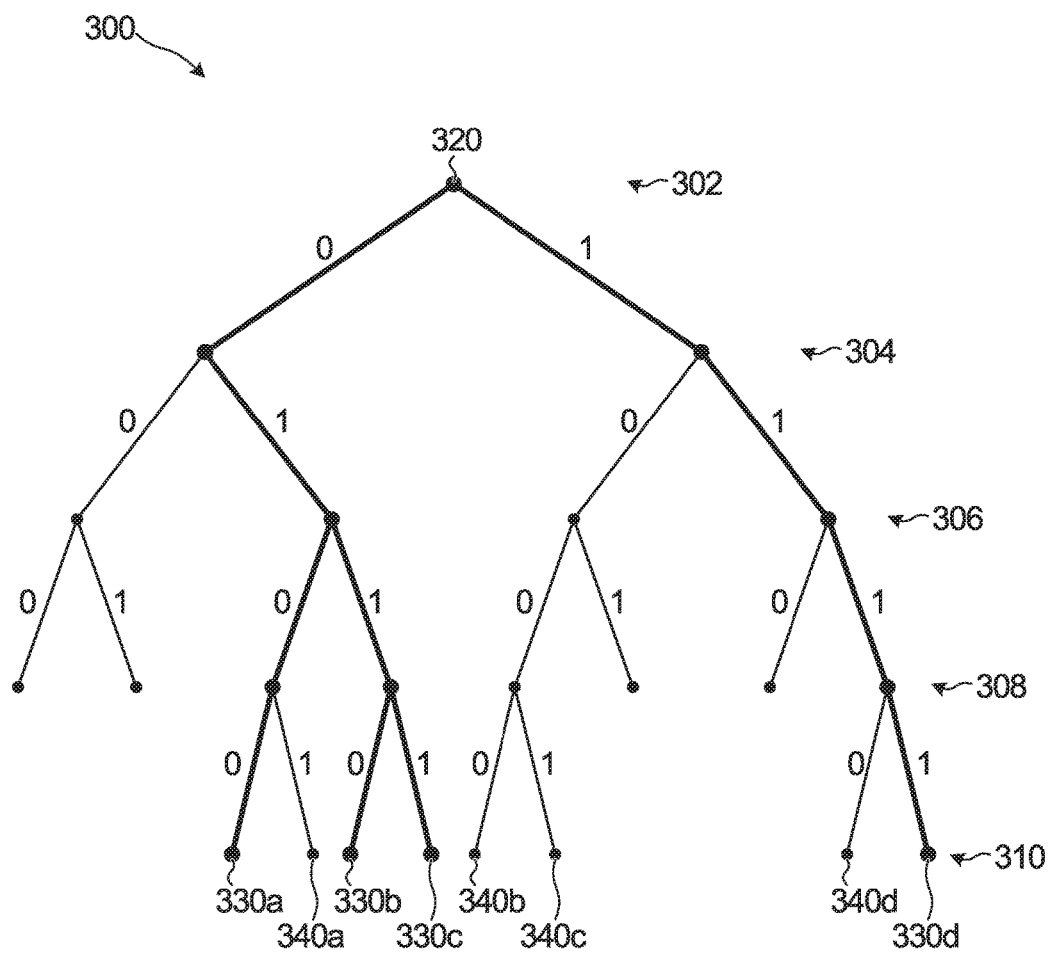
FIG. 3 is a diagram showing a portion of an example decision list tree whose width is limited by a maximum given list size and used in a Successive Cancellation List (SCL) polar decoder.

FIG. 3 is a diagram showing a portion of an example decision list tree 300 used in an SCL polar decoder, whose width is limited by a maximum given list size L. In FIG. 3 the list size L is 4. Five levels 302, 304, 306, 308, 310 of the decision tree are illustrated. Although five levels are illustrated, it should be understood that a decision tree to decode K information bits (including CRC bits) would have K+1 levels. At each level after the root level 302, each one of up to 4 surviving decoding paths is extended by one bit. The leaf or child nodes of root node 320 represent possible choices for a first bit, and subsequent leaf nodes represent possible choices for subsequent bits. The decoding path from the root node 320 to leaf node 330a, for example, represents an estimated codeword bit sequence: 0, 1, 0, 0. At level 308, the number of possible paths is greater than L, so L paths having the highest likelihood (e.g. best Path Metrics) are identified, and the remaining paths are discarded. The decoding paths that survive after the path sort at level 306 are shown in bold in FIG. 3. Similarly, at level 310, the number of possible paths is again greater than L, so the L paths having the highest likelihood (best PMs) are identified, and the remaining paths are again discarded. In the example shown, the paths terminating in leaf nodes 330a, 330b, 330c, and 330d represent the highest likelihood paths. The paths terminating in leaf nodes 340a, 340b, 340c, 340d are the lower likelihood paths which are discarded.

SCL decoding can be further divided into pure list decoding in which survivor paths with the highest likelihood are selected and CRC-Aided SCL (CA-SCL) decoding where CRC bits are used for path selection. A CRC may provide better error correction performance in the final path selection, but is optional in SCL decoding. Other decoding-assistant operations, such as a Parity Check (PC) based on parity or "PC" bits that are included in an input vector, could be used instead of or jointly with CRC bits in path selection during decoding or in the final path selection.

In an Additive White Gaussian Noise (AWGN) channel, a polar code in effect divides the channel into N sub-channels. N is referred to as the mother code length and is always a power of 2 in an Arikan polar code, which is based on a polar kernel that is a 2-by-2 matrix. A key to code construction for a polar code is to determine which bit-channels, also referred to herein as sub-channels, are selected or allocated for information bits and which sub-channels are allocated for frozen bits. In some embodiments, one or more sub-channels are also allocated to PC, CRC, and/or other types of bits that are used to assist in decoding. In terms of polarization theory, the sub-channels that are allocated for frozen bits are called frozen sub-channels, the sub-channels that are allocated for information bits are called information sub-channels, and additional assistant sub-channels may be allocated to assistant bits that are used to assist in decoding. In some embodiments, assistant bits are considered to be a form of information bits, for which more reliable sub-channels are selected or allocated.

Figure 4:
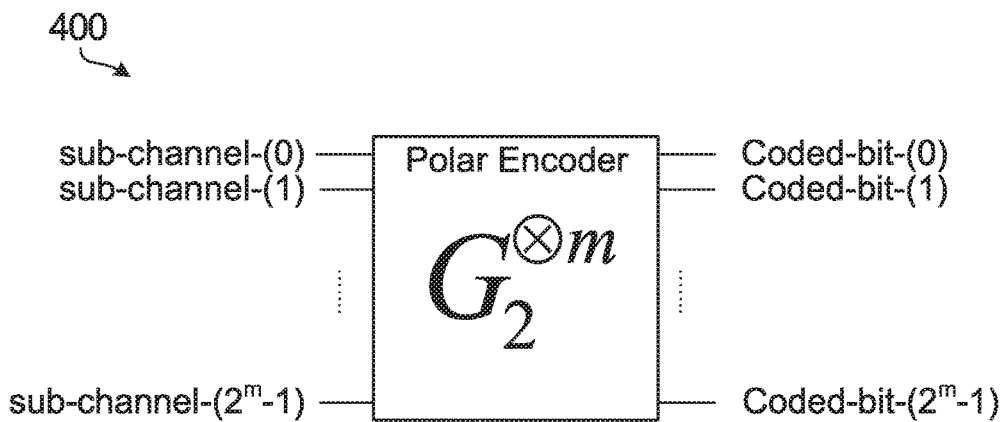
FIG. 4 is a block diagram illustrating an example of a polar encoder based on a 2-by-2 kernel.

Polar encoders based on Kronecker products of a 2-by-2 Arikan kernel $G_2$ are described above. FIG. 4 is a block diagram illustrating an example of a polar encoder 400 based on a 2-by-2 kernel. Sub-channels and coded bits are labeled in FIG. 4. A channel is divided into N sub-channels by a polar code as noted above. An information block and frozen bits are allocated onto the N sub-channels, and the resultant N-sized vector is multiplied with an N-by-N Kronecker matrix by the polar encoder 400 to generate a codeword that includes N coded bits. An information block includes at least information bits and could also include assistant bits such as CRC bits or PC bits. A sub-channel selector (not shown) could be coupled to the polar encoder 400 to select sub-channels for information bits and any assistant bits, with any remaining sub-channels being frozen sub-channels.

For polar codes that are based on a 2-by-2 kernel and an N-by-N Kronecker matrix, N is a power of 2. This type of kernel and polar codes based on such a kernel are discussed herein as illustrative examples. Other forms of polarization kernels with a different size (or number of inputs) could be generally characterized by code length $N=L^n$, where L is the dimension (i.e. size or number of inputs) of the applied kernel. In addition, polarization kernels such as other prime-number kernels (e.g. 3-by-3 or 5-by-5) or combinations of (prime or non-prime number) kernels to produce higher-order kernels could yield polarization among code sub-channels. It should also be noted that coded bit processing such as puncturing, shortening, zero padding, and/or repetition could be used in conjunction with polar codes that are based on 2-by-2 kernels or other types of kernels, for rate matching and/or other purposes for example.

As a result of SC, SCL, or CA-SCL decoding, the polarization phenomenon appears over the synthesized sub-channels. Some synthesized sub-channels have high capacity, and some sub-channels have low capacity. Put another way, some synthesized sub-channels have equivalently high Signal-to-Noise Ratio (SNR) and others have equivalently low SNR. These metrics are examples of characteristics that could be used to quantify or classify sub-channel "reliability". Other metrics indicative of sub-channel reliability can also be used.

Code construction involves determining a code rate (the number of information bits K, or how many sub-channels are to carry information bits) and selecting the particular K sub-channels among the N available sub-channels that are to carry information bits. For ease of reference herein, information bits could include input bits that are to be encoded, and possibly CRC bits, PC bits, and/or other assistant bits that are used to assist in decoding. Sub-channel selection is based on reliabilities of the sub-channels, and typically the highest reliability sub-channels are selected as information sub-channels for carrying information bits.

Sub-channel reliabilities could be specified, for example, in one or more ordered sequences. A single, nested, SNR-independent ordered sequence of sub-channels could be computed for a code length $N_{max}$, with ordered sequences for shorter code lengths N being selected from the longer $N_{max}$ sequence. Multiple ordered sequences in terms of different mother code lengths $N_i$ could instead be computed, and one of the mother code length sequences could be selected for a particular code based on preferred code length. Another possible option involves computing multiple ordered sequences in terms of SNR values, for example, and selecting an ordered sequence based on measured SNR.

There are also several methods to compute sub-channel reliabilities. For example, Mori R, Tanaka T., "Performance and construction of polar codes on symmetric binary-input memoryless channels", IEEE International Symposium on Information Theory, 2009, 1496-1500, proposes a density evolution (DE) method in which the reliability of a sub-channel is measured using the decoding error probabilities of Belief Propagation decoding, which can be calculated via density evolution. The proposed method is proven to be capacity-achieving for arbitrary symmetric binary erasure channels when used for polar construction. However, because the method relies on iterative calculations of LLR values for each sub-channel, it is computationally complex.

According to a genie-aided method proposed in E. Arikan, "Channel polarization: A method for constructing capacity-achieving codes for symmetric binary-input memoryless channels", IEEE Transactions on Information Theory, 2009, 55(7): 3051-3073, an encoder encodes on different sub-channels a training sequence that is known to the decoder. The decoder feeds back decoding results to the encoder so that the encoder can compute reliability statistics for every sub-channel, and a well-adapted reliability-vector over the sub-channels is obtained. The relative reliabilities for the sub-channels are dependent on the receiving SNR, making this method an SNR-dependent method.

A Gaussian-approximation (GA) method proposed in P. Trifonov, "Efficient design and decoding of polar codes." IEEE Trans. on Communications 60.11 (2012): 3221-3227, assumes that every coded bit is subjected to an equal error probability. From the error probability, the reliabilities over the sub-channels are obtained with a density evolution (DE) algorithm. Because this error probability on the coded bits is related to the receiving SNR, this method is SNR-related and is computationally complex.

An SNR-independent polarization weight (PW) method is disclosed in R1-1611254, "Details of the Polar Code Design", Huawei & HiSilicon, 3GPP TSG RAN WG1 Meeting #87. In this method, the reliability of a sub-channel is measured by the corresponding beta-expansion values, which are given by a closed-form formula as a function of the binary representation of the sub-channel index. The reliability measure is SNR-independent, and can lead to a single nested ordered sub-channel sequence for different coding rates and block lengths. The sequence may be calculated offline and stored in memory for use, to provide a lower implementation and computational complexity relative to other methods.

As mentioned above, there are several ways to generate an ordered sequence (from a kernel and its generator matrix) via calculating the sub-channel reliabilities. Not every way might necessarily lead to a nested sequence, and this nested sequence might not necessarily be unique. Nested ordered sequences could be generated, for example, based on a polarization weight as disclosed in Chinese Patent Application No. CN 201610619696.5, filed on Jul. 29, 2016, or based on a Hamming weight as disclosed in US Patent Application No. 62/438,565, filed on Dec. 23, 2016, both of which are entirely incorporated herein by reference. Other techniques could also or instead be used.

Ordered sequence computations can be performed in a number of different ways. For example, the computations could be performed online, producing ordered sequences that can be dynamically adjusted or recomputed based on, for example, observed channel conditions. The computations may alternatively be performed offline (i.e. in advance) to produce pre-computed (and static) ordered sequences that can be stored and retrieved during subsequent coding operations. In yet another alternative, the computations may be performed partially online and partially offline.

In mobile wireless communications, the channel conditions may significantly vary in time. It may be impractical to use online sequence computing methods with high computational complexity (e.g. genie-aided, DE and GA-based methods) because those methods may consume significant communication bandwidth and processing resources. Computationally complex methods, such as Genie-aided, DE and/or GA-based methods, are generally performed offline instead to produce multiple static ordered sequences, for example, by fixing a working SNR or reference SNR for different combinations of code length and code rate. However, simple online sequence generation methods such as those disclosed in U.S. Patent Application No. 62/463,128 entitled "APPARATUS AND METHODS OF SPECIFYING ORDERED SEQUENCES OF CODING SUB-CHANNELS" filed on Feb. 24, 2017 and incorporated herein by reference in its entirety may still be preferred, in that they generally consume less memory, and may be more flexible and adaptive to time-varying wireless channel conditions.

Encoding and decoding using polar codes are described generally above. In decoding polar coded information, a polar SCL decoder decodes N-bit codewords using a polar code algorithm with a collection of L decoding paths. This type of decoding is based on successive cancellation with an N-by-N polar code. To estimate a decoded bit value $\hat{u}_x$, a tree of M stages ($M=\log_2(N)$) composed of f and g nodes combines pairs of channel Log Likelihood Ratio (LLR) values with a partial sum of previously decoded bits.

Figure 5:
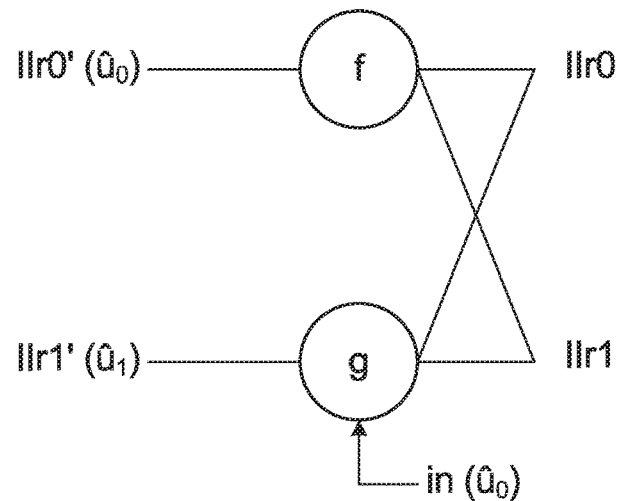
FIG. 5 is a block diagram of a 2-by-2 polar decoding kernel.

FIG. 5 is a block diagram of a 2-by-2 polar decoding kernel. The binary kernel in FIG. 5 is also referred to herein as an A2 kernel. Polar SC and SCL decoding algorithms are based on successive cancellation over such a kernel. There are two LLR inputs, llr0 and llr1 and two LLR outputs llr0' and llr1'. The LLR output llr0' is computed from llr0 and llr1 directly without any decoded bit decision, but llr1' cannot be computed until a decoding decision is made on $\hat{u}_0$ (Successive Cancellation).

The SC property of SC and SCL decoding limits the parallelism of an SC-based decoder. The theoretical latency of an SC-based decoder is ($2*2^n-2$), where n=M and is the number of decoding stages.

SCL decoding is often used for better performance than SC decoding, but each of the L list paths needs a trunk of memory to save its channel LLR metrics and others. Memory space complexity is $O(L*2^n)$, where n=M and is the number of decoding stages and L is list size, as noted above. L determines decoding performance, and a smaller L generally results in worse BLER performance. However, the processing associated with maintaining L paths during SCL decoding can lead to relatively low throughput, and also relatively low hardware and power efficiency. Therefore, even though polar encoding may have good performance, there may be a high implementation cost in decoding.

Maximum Likelihood (ML)-SC combines several-bit hard-decision with decoding in an effort to reduce polar decoding latency, but is very complicated, and only useful for decoding very short blocks. Simplified SC (SSC) decoding exploits multi-bit patterns and uses pattern identification, but this involves more memory than SC decoding, is only feasible for non-list or very small-list decoders.

Dynamic re-calculation of interim or intermediate LLR metrics could reduce decoder memory to about ¼ of memory size for SCL decoding, but requires intermediate LLRs to be recalculated as they are needed. Also, although such recalculation reduces LLR memory, it may increase memory requirements elsewhere in a decoder, for storing partial sums for example, which reduces overall memory savings.

Conventional decoding techniques to provide effective ways to reduce the number of decoding stages (n=M), which as noted above is directly related to N (codeword length), or memory size.

Figure 6A:
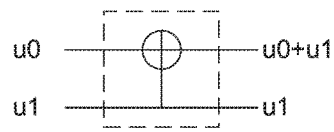
FIG. 6(a) is a block diagram of an example 2-by-2 polar coding kernel.
Figure 6B:
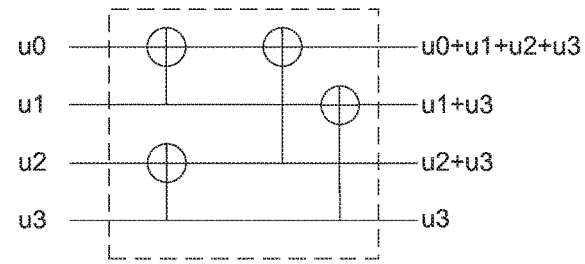
FIG. 6(b) is a block diagram of an example higher-order polar coding kernel based on combining two of the example 2-by-2 kernels in FIG. 3(a).

FIG. 6(a) is a block diagram of an example 2-by-2 polar coding kernel, which is the basis for the decoding kernel in FIG. 5. The polar coding kernel inputs are information bits $u_0$, $u_1$, and the kernel outputs are $u_0+u_1$ and $u_1$. The example higher-order polar coding kernel in FIG. 6(b) is based on combining two of the example 2-by-2 kernels in FIG. 6(a).

Figure 7A:
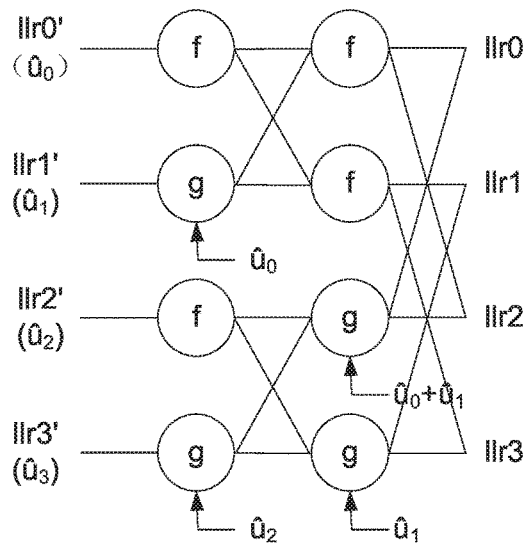
FIG. 7(a) is a block diagram of a coding length 4 polar decoder.
Figure 7B:
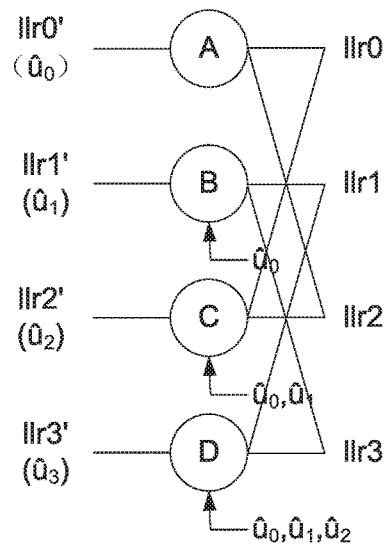
FIG. 7(b) is a block diagram of an example higher-order polar decoding kernel.

FIG. 7(a) is a block diagram of a coding length 4 polar decoder based on an A2 decoding kernel. FIG. 7(b) is a block diagram of an example higher-order polar decoding kernel, referred to herein as an A4 kernel. The representation in FIG. 6(b) might be more often associated with encoding, whereas the representation in FIG. 7(b), with LLR values, might be more often associated with decoding.

The f nodes in FIG. 7(a) combine pairs of LLR values, and the g nodes combine LLR values with the previously decoded bit values as shown. According to an embodiment, an A4 kernel as shown in FIG. 7(b) includes processing nodes in a single stage, instead of the two stages shown in FIG. 7(a).

An A2 kernel has two functions:

f-function: llr0'=sgn(llr0)·sgn(llr1)·min(|llr0|,|llr1|)

g-function: llr1'=llr1+sgnb($\hat{u}_0$)·llr0 (equivalent to the expression in FIG. 2).

An A4 kernel has four functions:

A-function: llr0'=sgn(llr0)·sgn(llr1)·sgn(llr2)·sgn(llr3)·min(|llr0|,|llr1|,|llr2|,|llr3|)

B-function:

llr1'=sgn(llr1)·sgn(llr3)·min(|llr1|,|llr3|)+sgnb($\hat{u}_0$)sgn(llr0)·sgn(llr2)·min(|llr0|,|llr2|), or equivalently

| $\hat{u}_0$ | llr1' |
|---|---|
| 0 | sgn(llr1) * sgn(llr3) * min{|llr1|, |llr3|} + sgn(llr0) * sgn(llr2) * min{|llr0|, |llr2|} |
| 1 | sgn(llr1) * sgn(llr3) * min{|llr1|, |llr3|} − sgn(llr0) * sgn(llr2) * min{|llr0|, |llr2|} |

C-function:

llr2'=sgn(sgnb($\hat{u}_0 \oplus \hat{u}_1$)·llr0+llr2)*sgn(sgnb($\hat{u}_1$)·llr1+llr3) *min{|sgnb($\hat{u}_0 \oplus \hat{u}_1$)·llr0+llr2|,|sgnb($\hat{u}_1$)·llr1+llr3|} or equivalently

| $\hat{u}_0$ | $\hat{u}_1$ | llr2' |
|---|---|---|
| 0 | 0 | sgn(llr0 + llr2) * sgn(llr1 + llr3) * min{|llr0 + llr2|, |llr1 + llr3|} |
| 0 | 1 | sgn(−llr0 + llr2) * sgn(−llr1 + llr3) * min{|−llr0 + llr2|, |−llr1 + llr3|} |
| 1 | 0 | sgn(−llr0 + llr2) * sgn(llr1 + llr3) * min{|−llr0 + llr2|, |llr1 + llr3|} |
| 1 | 1 | sgn(llr0 + llr2) * sgn(−llr1 + llr3) * min{|llr0 + llr2|, |−llr1 + llr3|} |

D-function: llr3'=sgnb($\hat{u}_0 \oplus \hat{u}_1 \oplus \hat{u}_2$)·llr0+sgnb($\hat{u}_1$)·llr1+sgnb($\hat{u}_2$)·llr2+llr3, or equivalently

| $\hat{u}_0$ | $\hat{u}_1$ | $\hat{u}_2$ | llr3' |
|---|---|---|---|
| 0 | 0 | 0 | llr0 + llr1 + llr2 + llr3 |
| 0 | 0 | 1 | −llr0 + llr1 − llr2 + llr3 |
| 0 | 1 | 0 | −llr0 − llr1 + llr2 + llr3 |
| 0 | 1 | 1 | llr0 − llr1 − llr2 + llr3 |
| 1 | 0 | 0 | −llr0 + llr1 + llr2 + llr3 |
| 1 | 0 | 1 | llr0 + llr1 − llr2 + llr3 |
| 1 | 1 | 0 | llr0 − llr1 + llr2 + llr3 |
| 1 | 1 | 1 | −llr0 − llr1 − llr2 + llr3 | where $$\mathrm{sgn}(w) = \begin{cases} + & w \geq 0 \\ - & w < 0 \end{cases};$$

min( ) is minimum;

$$\mathrm{sgn}b(b) = \begin{cases} + & b = 0 \\ - & b = 1 \end{cases};$$

and $\oplus$ is XOR.

These A/B/C/D functions are equivalent to combining the f/g functions shown in FIG. 7(a).

Figure 8:
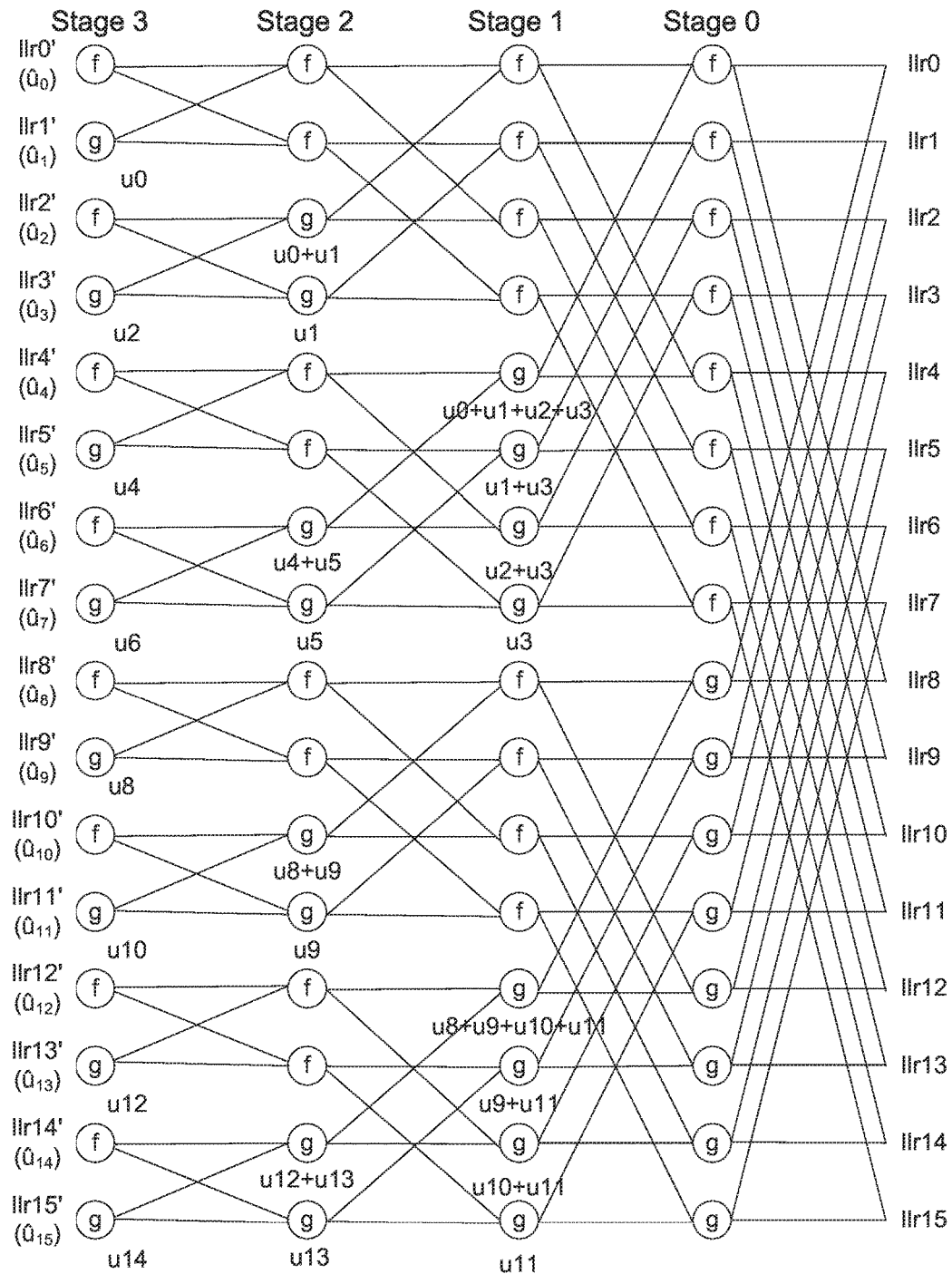
FIG. 8 is a block diagram of nodes in a Data Dependency Graph (DDG) for an example polar decoder.

FIG. 8 is a block diagram of nodes in a Data Dependency Graph (DDG) for an example polar decoder, and illustrates the LLR tree for a codeword length of N=16 bits. In this example, the decoder has 4 stages with 8 nodes per stage. Each node implements an f function and a g function, in circuitry such as a Processing Element (PE) that is configurable to execute the f function or the g function. Each node is visited twice at each stage to decode a codeword, first to execute the f function and then to execute the g function. The f functions of the nodes, also referred to herein as f nodes, combine only LLR values. The g functions of the nodes, also referred to herein as g nodes, use partial sums of previously decoded bits in addition to LLR values. Partial sums that are used by the g nodes in Stage 0 are not shown in FIG. 8 to avoid congestion in the drawings. Channel LLR values, which represent bits that are received over a communication medium, are shown at the right-hand side of FIG. 8, and the final LLR stage outputs LLR values from which decisions on the decoded bits $\hat{u}_0$ to $\hat{u}_{15}$ are made.

The decoder traverses the LLR tree from right (Stage #0) to left (Stage #3), top to bottom. To estimate the value $\hat{u}_0$ of the decoded bit #0:

1. Stage #0 f nodes #0-7 combine 16 channel LLR values in up to 8 parallel PE units
2. Stage #1 f nodes #0-3 combine stage #0 LLR results in up to 4 parallel PE units
3. Stage #2 f nodes #0-1 combine stage #1 LLR results in up to 2 parallel PE units
4. Stage #3 f node #0 combines stage #2 LLR results in 1 PE unit.

The decoder uses the stage #3 (last) LLR result to estimate the decoded bit #x value $\hat{u}_x$. If the LLR value>=0, then the decoded bit #x estimated value $\hat{u}_x$ is most likely a 0, and if the LLR value<0, then the decoded bit #x estimated value $\hat{u}_x$ is most likely a 1.

The decoder may store the intermediate Stage #0-Stage #2 LLR values, so that estimation of the next decoded bits need not start over at Stage #0. For example, with the intermediate values available from LLR memory, to estimate the value $\hat{u}_1$ of the decoded bit #1:

5. Stage #3 g node #0 combines Stage #2 LLR results with partial sum $\hat{u}_0$.

To estimate the value $\hat{u}_2$ of the decoded bit #2:

6. Stage #2 g nodes #0-1 combine Stage #1 LLR results with partial sums $\hat{u}_0+\hat{u}_1$ and $\hat{u}_1$
    7. Stage #3 f node #1 combines Stage #2 LLR results.

To estimate the value $\hat{u}_3$ of the decoded bit #3:

8. Stage #3 g node #1 combines Stage #2 LLR results with partial sum $\hat{u}_2$.

To estimate the value $\hat{u}_4$ of the decoded bit #4:

9. Stage #1 g nodes #0-3 combine Stage #0 LLR results with partial sums $\hat{u}_0+\hat{u}_1+\hat{u}_2+\hat{u}_3$, $\hat{u}_1+\hat{u}_3$, $\hat{u}_2+\hat{u}_3$ and $\hat{u}_3$
    10. Stage #2 f nodes #2-3 combine Stage #1 LLR results
    11. Stage #3 f node #2 combines Stage #2 LLR results.

The decoder repeats this recursive process until it reaches the last codeword bit $\hat{u}_{N-1}$.

Figure 9:
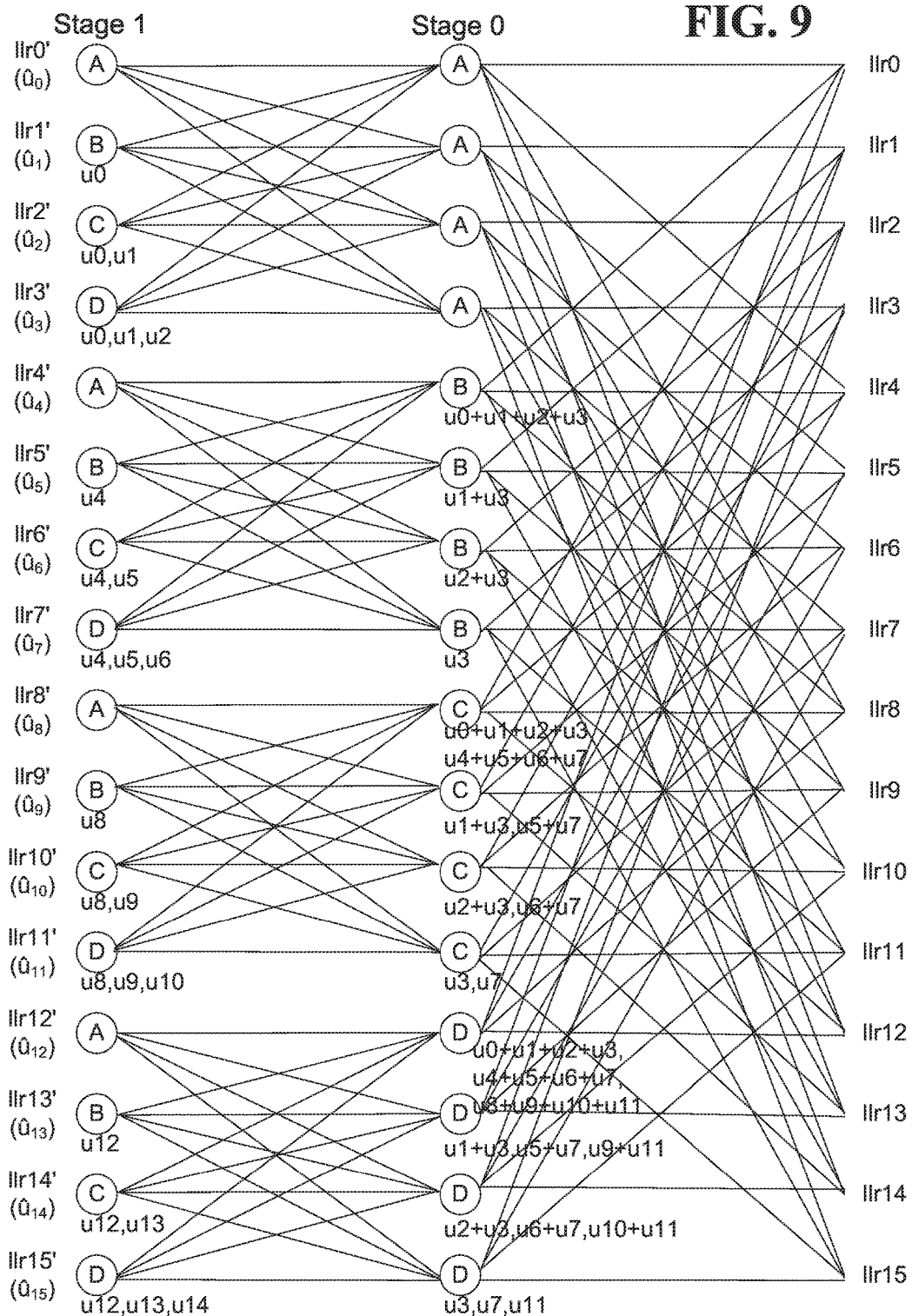
FIG. 9 is a block diagram of nodes in a DDG for an example polar decoder according to an embodiment.

FIG. 9 is a block diagram of nodes in a DOG for an example polar decoder according to an embodiment. The DOG in FIG. 9, for the same codeword length of N=16, has only 2 stages instead of the 4 stages in conventional polar decoding as shown in FIG. 8. This can significantly reduce latency. For example, the final Stage 1 LLRs for bit $\hat{u}_0$ in FIG. 9 is available after parallel processing of the Stage 0 A nodes and processing of the first Stage 1 A node in only 2 processing cycles, compared to 4 cycles for FIG. 8. A detailed comparison of processing paths and the partial sum values in FIG. 9 with those of FIG. 8 similarly reveals other processing cycle savings, and thus latency reduction, with the reduced-stage decoding according to FIG. 9.

A decoding approach based on FIG. 9 also reduces total memory space requirements relative to an implementation of FIG. 8 in which all intermediate LLR values are stored to memory. In FIG. 8, there are 8 intermediate LLR values output from the Stage 0 f nodes, 4 from the Stage 1 f nodes 1 to 4, 2 from the Stage 2 f nodes 1 and 2, and the final LLR value from the Stage 3 f node 1 would also be stored, for a total of 15 LLR values associated with decoding each bit. In FIG. 9, this is reduced to only 5 values, including the 4 intermediate values from the Stage 0 A nodes and the final LLR value from the first A node at Stage 1. In addition, the fact that fewer LLR values are needed for later-stage calculations means that the number of memory accesses during decoding is also reduced relative to conventional decoding.

The examples in FIGS. 8 and 9 relate to decoding a 16-bit codeword and only one decoding path. The following table illustrates potential latency and memory reductions for a longer codeword length and only one decoding path, and savings could be even more significant for longer list lengths.

|  | A2 kernel | A4 kernel |
| --- | --- | --- |
| N = 1024 theoretic minimum latency | 2046 (2 * N − 2) | 1364 (4 * (N − 1)/3) |
| N = 1024 memory required for LLR metrics | 1023 | 341 |

The embodiments disclosed herein affect decoding, but may be used in conjunction with conventional A2 kernel-based encoding. It should also be noted that higher-order decoding kernels as disclosed herein need not be used exclusively from other decoder kernels. For example, for N=2048, a conventional decoder has 11 LLR stages. This could be reduced to 5 A4 LLR stages and 1 A2 LLR stage.

Mathematically, an A4 kernel-based decoder should have the same performance as an A2 kernel-based decoder.

Combining smaller kernels into larger kernels can be extended beyond A2 and A4 kernels as described above. For example, the same idea can be extended to A8, A16, or even larger or higher-order kernel decoders. Both Latency and memory size may be further reduced in this manner.

Figure 10:
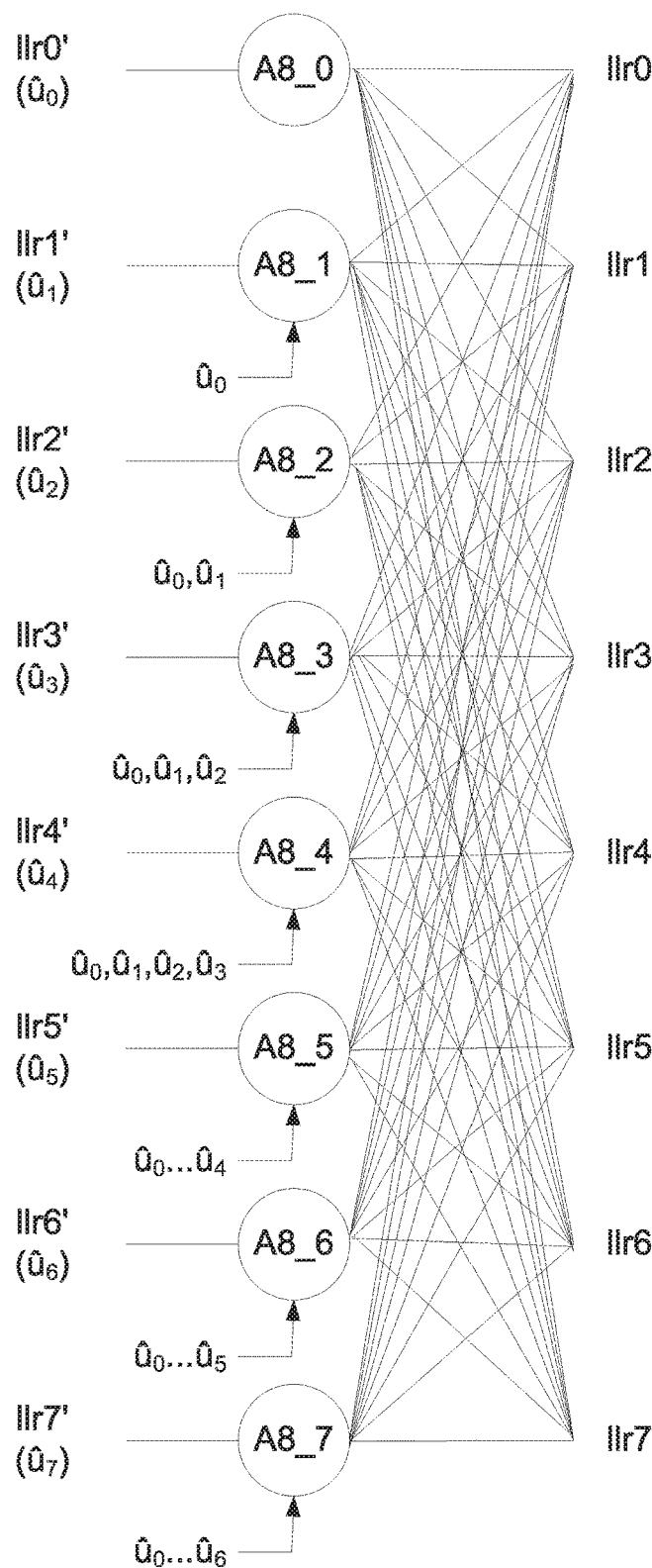
FIG. 10 is a block diagram illustrating another example higher-order polar decoding kernel.

FIG. 10 is a block diagram illustrating another example higher-order polar decoding kernel, specifically an A8 kernel with 8 inputs and 8 outputs, to combine 3 ($\log_2 8$) A2 stages into a single stage. The A8 kernel in FIG. 10 uses the partial sums as shown, and has 8 functions A8_0 to A8_7:

A8_0 function:
llr0′=sgn(llr0)*sgn(llr1)*sgn(llr2)*sgn(llr3)*sgn(llr4)*sgn(llr5)*sgn(llr6)*sgn(llr7)*min{|llr0|,|llr1|,|llr2|,|llr3|,|llr4|,|llr5|,|llr6|,|llr7|}

A8_1 function:
llr1′=sgnb($\hat{u}_0$)*sgn(llr0)*sgn(llr2)*sgn(llr4)*sgn(llr6)*min{|llr0|,|llr2|,|llr4|,|llr6|}+sgn(llr1)*sgn(llr3)*sgn(llr5)*sgn(llr7)*min{|llr1|,|llr3|,|llr5|,|llr7|}

A8_2 function:
temp1=sgnb($\hat{u}_0 \oplus \hat{u}_1$)·[sgn(llr0)·sgn(llr4)·min(|llr0|,|llr4|)]+sgn(llr2)·sgn(llr6)·min(|llr2|,|llr6|)
temp2=sgnb($\hat{u}_1$)·[sgn(llr1)·sgn(llr5)·min(|llr1|,|llr5|)]+sgn(llr3)·sgn(llr7)·min(|llr3|,|llr7|)
llr2′=sgn(temp1)·sgn(temp2)·min(|temp1|,|temp2|)

A8_3 function:

$$ll3' = \text{sgn}b(\hat{u}_0 \oplus \hat{u}_1 \oplus \hat{u}_2) \cdot \text{sgn}(llr0) \cdot \text{sgn}(llr4) \cdot \min(|llr0|, |llr4|) +$$
$$\text{sgn}b(\hat{u}_2) \cdot \text{sgn}(llr2) \cdot \text{sgn}(llr6) \cdot \min(|llr2|, |llr6|) +$$
$$\text{sgn}b(\hat{u}_1) \cdot \text{sgn}(llr1) \cdot \text{sgn}(llr5) \cdot \min(|llr1|, |llr5|) +$$
$$\text{sgn}(llr3) \cdot \text{sgn}(llr7) \cdot \min(|llr3|, |llr7|)$$

A8_4 function:
temp1=sgnb($\hat{u}_0 \oplus \hat{u}_1 \oplus \hat{u}_2 \oplus \hat{u}_3$)·llr0+llr4
temp2=sgnb($\hat{u}_1 \oplus \hat{u}_3$)·llr1+llr5
temp3=sgnb($\hat{u}_2 \oplus \hat{u}_3$)·llr2+llr6
temp4=sgnb($\hat{u}_3$)·llr3+llr7
llr4′=sgn(temp1)·sgn(temp2)·sgn(temp3)·sgn(temp4)·min(|temp1|,|temp2|,|temp3|,|temp4|)

A8_5 function:
temp1=sgnb($\hat{u}_0 \oplus \hat{u}_1 \oplus \hat{u}_2 \oplus \hat{u}_3$)·llr0+llr4
temp2=sgnb($\hat{u}_1 \oplus \hat{u}_3$)·llr1+llr5
temp3=sgnb($\hat{u}_2 \oplus \hat{u}_3$)·llr2+llr6
temp4=sgnb($\hat{u}_3$)·llr3+llr7
llr5′=sgnb($\hat{u}_4$)·[sgn(temp1)·sgn(temp3)·min{|temp1|,|temp3|}]+[sgn(temp2)·sgn(temp4)·min{|temp2|,|temp4|}]

A8_6 function:
temp1=sgnb($\hat{u}_0 \oplus \hat{u}_1 \oplus \hat{u}_2 \oplus \hat{u}_3 \oplus \hat{u}_4 \oplus \hat{u}_5$)·llr0+sgnb($\hat{u}_2 \oplus \hat{u}_3$)·llr2+sgnb($\hat{u}_4 \oplus \hat{u}_5$)·llr4+llr6
temp2=sgnb($\hat{u}_1 \oplus \hat{u}_3 \oplus \hat{u}_5$)·llr1+sgnb($\hat{u}_3$)·llr3+sgnb($\hat{u}_5$)·llr5+llr7
llr6′=sgn(temp1)·sgn(temp2)·min(|temp1|,|temp2|)

A8_7 function:

$$llr7' = \text{sgn}b(\hat{u}_0 \oplus \hat{u}_1 \oplus \hat{u}_2 \oplus \hat{u}_3 \oplus \hat{u}_4 \oplus \hat{u}_5 \oplus \hat{u}_6) \cdot llr0 +$$
$$\text{sgn}b(\hat{u}_1 \oplus \hat{u}_3 \oplus \hat{u}_5) \cdot llr1 + \text{sgn}b(\hat{u}_2 \oplus \hat{u}_3 \oplus \hat{u}_6) \cdot llr2 + \text{sgn}b(\hat{u}_3) \cdot llr3 +$$
$$\text{sgn}b(\hat{u}_4 \oplus \hat{u}_5 \oplus \hat{u}_6) \cdot llr4 + \text{sgn}b(\hat{u}_5) \cdot llr5 + \text{sgn}b(\hat{u}_6) \cdot llr6 + llr7$$

These are example expressions of the A8 functions. Different representations that are equivalent to combined A2 f and g functions and the above A8 functions are possible.

Figure 11:
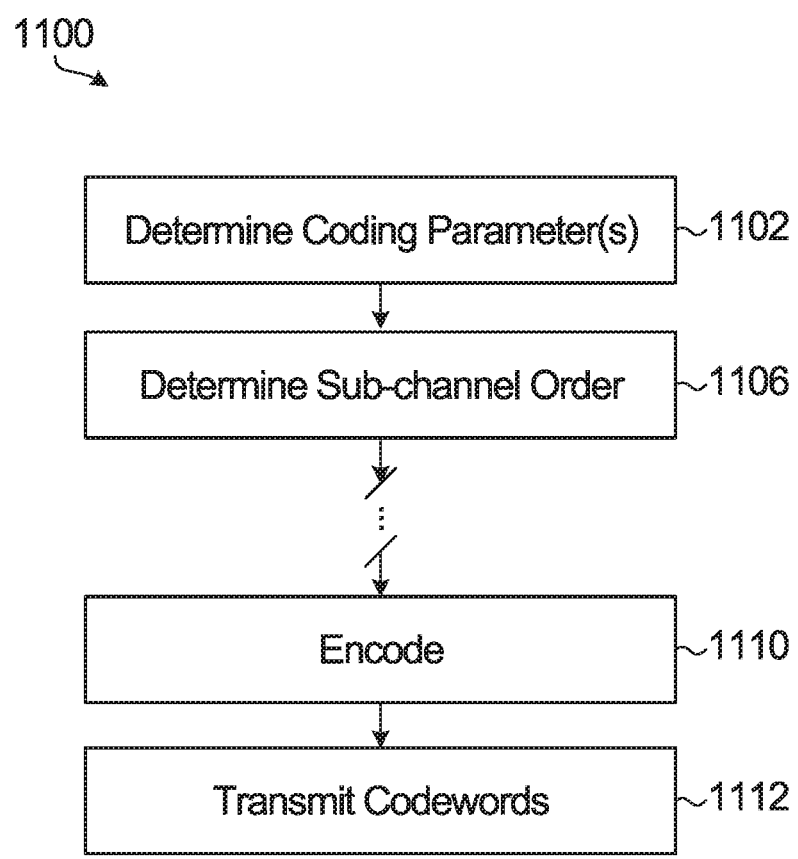
FIG. 11 is a flow diagram of an example coding method.

Although the present disclosure relates primarily to decoding, in the interest of completeness encoding is also discussed briefly herein. FIG. 11 is a flow diagram of an example coding method 1100, which includes determining one or more coding parameters at 1102. The coding parameter(s) could include at least a mother code length N, which could be read from memory or otherwise provided. N could be computed based on a given information block length K and a given code rate R, for example. At 1106, a reliability order of sub-channels is determined. A rule set could be used to reduce the number of reliability computations and polynomial comparisons that are involved in determining sub-channel order at 1106, for example, which could make it feasible to determine sub-channel order online when information is to be encoded or decoded.

An ordered sub-channel sequence as determined at 1106 could be used to select information sub-channels, frozen sub-channels, and/or other types of sub-channels when information is to be encoded at 1110. Codewords are then transmitted at 1112.

The example method in FIG. 11 is intended for illustrative purposes. Other embodiments could involve performing the illustrated operations in any of various ways, performing fewer or additional operations, and/or varying the order in which operations are performed.

Figure 12:
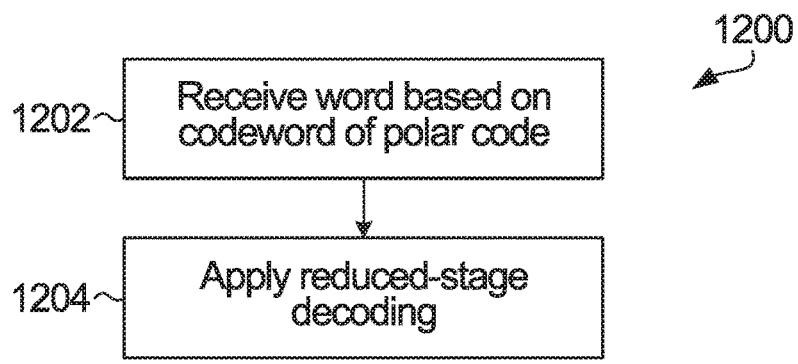
FIG. 12 is a flow diagram of an example method according to an embodiment.

FIG. 12 is a flow diagram of an example method according to an embodiment. The method 1200 involves receiving a word that is based on an N-bit codeword of a polar code at 1202, and applying reduced-stage decoding at 1204, to decode the received word in fewer than $\log_2 N$ LLR stages. The LLR stages include at least one higher-order LLR stage as described herein, with nodes implementing functions that are based on a combination of lower-order polar code kernels.

For example, the lower-order polar code kernels could be 2-by-2 A2 polar code kernels. Using A4 kernels based on A2 kernels for decoding an N-bit codeword from a received word, for example, a polar decoder with only $(\log_2 N)/2$ LLR stages, instead of $\log_2 N$ LLR stages, could be used to decode codewords from received words if $\log_2 N$ is even. If $\log_2 N$ is odd, then an A2 stage could be used in combination with one or more A4 stages, for a total of $((\log_2 N)+1)/2$ LLR stages. An A8 stage could replace a group of 4 A2 stages or a group of 2 A4 stages, for example, and could be used in combination with other stages of the same size or different size(s) to implement reduced-stage decoding. The total number of stages in a reduced-stage decoder is always less than $\log_2 N$.

The functions implemented by higher-order LLR stages could include the A, B, C, and D functions of an A4 kernel as disclosed herein, or equivalent functions. The functions could also or instead include the A8 functions or equivalent functions. One or more LLR stages with f and g nodes could be used in combination with one or more higher-order stages. There may be several reduced-stage options to realize a reduced stage decoder. For N=2048, for example, $\log_2 N=11$. The 11 LLR stages of a conventional polar decoder could be replaced with 5 A4 stages plus an A2 stage; 2 A8 stages, an A4 stage, and an A2 stage; or 1 A16 stage, an A4 stage, and an A2 stage. A combination of higher-order stages could be selected by trading off complexity of the higher-stage functions against the associated latency and memory access reductions, for example.

The example method 1200 is intended for illustrative purposes. Other embodiments could involve performing the illustrated operations in any of various ways, performing fewer or additional operations, and/or varying the order in which operations are performed.

Figure 13:
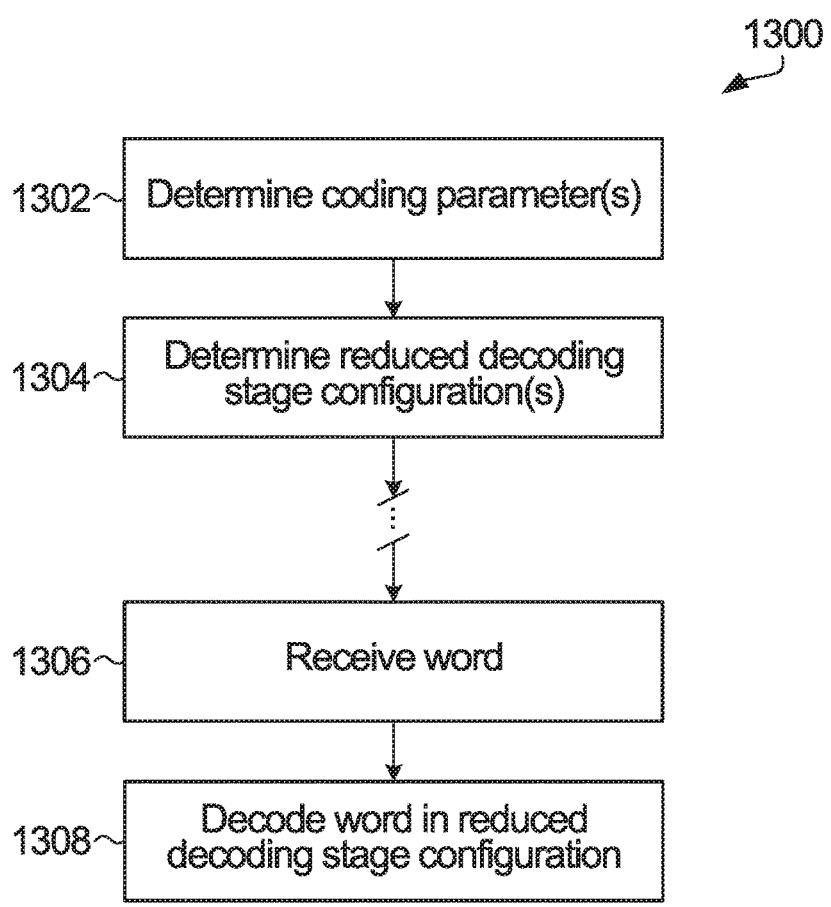
FIG. 13 is a flow diagram of an example method according to another embodiment.

FIG. 13 is a flow diagram of an example method according to another embodiment. The example method 1300 includes determining one or more coding parameters at 1302. The coding parameter(s) could include at least a mother code length N, which could be read from memory or otherwise provided. N could be computed based on a given information block length K and a given code rate R, for example. At 1304, one or more reduced decoding stage configurations are determined. Reduced decoding stage configurations could be based on one or more coding parameters as N, and other criteria such as processing element availability for executing decoder functions. Different reduced decoding stage configurations could be determined for different values of N, for example, or multiple different reduced decoding stage configurations could be determined for a single value of N as in the above examples for N=2048.

The reduced decoding stage configuration(s) determined at 1304 could be stored for later use during decoding, or generated online at decoding time. In one embodiment, multiple reduced decoding stage configurations are determined at 1304, and a selection is made during decoding based on one or more decoding conditions, such as N.

After a word based on a codeword of a code is received at 1306, the word is decoded at 1308 using a reduced decoding stage configuration that was determined at 1304. For example, the decoding at 1308 could involve selecting a reduced decoding stage configuration from multiple configurations that were determined at 1304.

FIG. 13 represents another illustrative example of a method according to an embodiment. Variations are contemplated. For example, for online decoding methods, the determinations at 1302, 1304 could be made after a word is received at 1306. It should also be appreciated that a reduced decoding stage configuration need not necessarily be determined or selected for every received word. Once selected, a reduced decoding stage configuration could be used for decoding multiple received words, until N and/or other decoding conditions change for example.

Other variations could be or become apparent to a skilled person based on the present disclosure. For example, any one or more of the following could be provided, alone or in any of various combinations, in embodiments:
the LLR stages include a higher-order LLR stage with nodes implementing functions based on a combination of lower-order polar code kernels;
the lower-order polar code kernels are 2-by-2 polar code kernels;
the functions include one or more of the following A, B, C, and D functions or equivalent functions consistent therewith:

A-function: $llr0' = sgn(llr0) \cdot sgn(llr1) \cdot sgn(llr2) \cdot sgn(llr3) \cdot \min(|llr0|,|llr1|,|llr2|,|llr3|)$ B-function:
$llr1' = sgn(llr1) \cdot sgn(llr3) \cdot \min(|llr1|,|llr3|) + sgnb(\hat{u}_0)sgn(llr0) \cdot sgn(llr2) \cdot \min(|llr0|,|llr2|)$, or equivalently

| $\hat{u}_0$ | llr1' |
|---|---|
| 0 | $sgn(llr1) * sgn(llr3) * \min\{|llr1|, |llr3|\} + sgn(llr0) * sgn(llr2) * \min\{|llr0|, |llr2|\}$ |
| 1 | $sgn(llr1) * sgn(llr3) * \min\{|llr1|, |llr3|\} - sgn(llr0) * sgn(llr2) * \min\{|llr0|, |llr2|\}$ |

C-function:
$llr2' = sgn(\hat{u}_0 \oplus \hat{u}_1) \cdot llr0 + llr2) * sgn(sgnb(\hat{u}_1) \cdot llr1 + llr3) * \min\{|sgnb(\hat{u}_0 \oplus \hat{u}_1) \cdot llr0 + llr2|, |sgnb(\hat{u}_1) \cdot llr1 + llr3|\}$ or equivalently

| $\hat{u}_0$ | $\hat{u}_1$ | llr2' |
|---|---|---|
| 0 | 0 | sgn(llr0 + llr2) * sgn(llr1 + llr3) * min{|llr0 + llr2|, |llr1 + llr3|} |
| 0 | 1 | sgn(−llr0 + llr2) * sgn(−llr1 + llr3) * min{|−llr0 + llr2|, |−llr1 + llr3|} |
| 1 | 0 | sgn(−llr0 + llr2) * sgn(llr1 + llr3) * min{|−llr0 + llr2|, |llr1 + llr3|} |
| 1 | 1 | sgn(llr0 + llr2) * sgn(−llr1 + llr3) * min{|llr0 + llr2|, |−llr1 + llr3|} |

D-function: llr3'=sgnb($\hat{u}_0 \oplus \hat{u}_1 \oplus \hat{u}_2$)·llr0+sgnb($\hat{u}_1$)·llr1+sgnb($\hat{u}_2$)·llr2+llr3, or equivalently

| $\hat{u}_0$ | $\hat{u}_1$ | $\hat{u}_2$ | llr3' |
|---|---|---|---|
| 0 | 0 | 0 | llr0 + llr1 + llr2 + llr3 |
| 0 | 0 | 1 | −llr0 + llr1 − llr2 + llr3 |
| 0 | 1 | 0 | −llr0 − llr1 + llr2 + llr3 |
| 0 | 1 | 1 | llr0 − llr1 − llr2 + llr3 |
| 1 | 0 | 0 | −llr0 + llr1 + llr2 + llr3 |
| 1 | 0 | 1 | llr0 + llr1 − llr2 + llr3 |
| 1 | 1 | 0 | llr0 − llr1 + llr2 + llr3 |
| 1 | 1 | 1 | −llr0 − llr1 − llr2 + llr3 | where
$\hat{u}_x$ are estimated bit values;
llrx are input LLR values;
llrx' are output LLR values;

$$\text{sgn}(w) = \begin{cases} + & w \geq 0 \\ - & w < 0 \end{cases};$$

min( ) is minimum;

$$\text{sgn}b(b) = \begin{cases} + & b = 0 \\ - & b = 1 \end{cases};$$

and
$\oplus$ is XOR;
the functions include one or more of the following A8 functions or equivalent functions consistent therewith:
A8_0 function:
llr0'=sgn(llr0)*sgn(llr1)*sgn(llr2)*sgn(llr3)*sgn(llr4)*sgn(llr5)*sgn(llr6)*sgn 7)*min{|llr0|,|llr1|,|llr2|,|llr3|,|llr4|,|llr5|,|llr6|,|llr7|}
A8_1 function:
llr1'=sgnb($\hat{u}_0$)*sgn(llr0)*sgn(llr2)*sgn(llr4)*sgn(llr6)*min{|llr0|,|llr2|,|llr4|,|llr6|}+sgn(llr1)*sgn(llr3)*sgn(llr5)*sgn(llr7)*min{|llr1|,|llr3|,|llr5|,|llr7|}
A8_2 function:
temp1=sgnb($\hat{u}_0 \oplus \hat{u}_1$)·[sgn(llr0)·sgn(llr4)·min(|llr0|,|llr4|)]+sgn(llr2)·sgn(llr6)·min(|llr2|,|llr6|)
temp2=sgnb($\hat{u}_1$)·[sgn(llr1)·sgn(llr5)·min(|llr1|,|llr5|)]+sgn(llr3)·sgn(llr7)·min(|llr3|,|llr7|)
llr2'=sgn(temp1)·sgn(temp2)·min(|temp1|,|temp2|)
A8_3 function:

$ll3' = \text{sgn}b(\hat{u}_0 \oplus \hat{u}_1 \oplus \hat{u}_2) \cdot \text{sgn}(llr0) \cdot \text{sgn}(llr4) \cdot \min(|llr0|, |llr4|) +$ $\text{sgn}b(\hat{u}_2) \cdot \text{sgn}(llr2) \cdot \text{sgn}(llr6) \cdot \min(|llr2|, |llr6|) +$ $\text{sgn}b(\hat{u}_1) \cdot \text{sgn}(llr1) \cdot \text{sgn}(llr5) \cdot \min(|llr1|, |llr5|) +$ $\text{sgn}(llr3) \cdot \text{sgn}(llr7) \cdot \min(|llr3|, |llr7|)$ A8_4 function:
temp1=sgnb($\hat{u}_0 \oplus \hat{u}_1 \oplus \hat{u}_2 \oplus \hat{u}_3$)·llr0+llr4
temp2=sgnb($\hat{u}_1 \oplus \hat{u}_3$)·llr1+llr5
temp3=sgnb($\hat{u}_2 \oplus \hat{u}_3$)·llr2+llr6
temp4=sgnb($\hat{u}_3$)·llr3+llr7
llr4'=sgn(temp1)·sgn(temp2)·sgn(temp3)·sgn(temp4)·min(|temp1|,|temp2|,|temp3|,|temp4|)
A8_5 function:
temp1=sgnb($\hat{u}_0 \oplus \hat{u}_1 \oplus \hat{u}_2 \oplus \hat{u}_3$)·llr0+llr4
temp2=sgnb($\hat{u}_1 \oplus \hat{u}_3$)·llr1+llr5
temp3=sgnb($\hat{u}_2 \oplus \hat{u}_3$)·llr2+llr6
temp4=sgnb($\hat{u}_3$)·llr3+llr7
llr5'=sgnb($\hat{u}_4$)·[sgn(temp1)·sgn(temp3)·min{|temp1|,|temp3|}]+[sgn(temp2)·sgn(temp4)·min{|temp2|,|temp4|}]
A8_6 function:
temp1=sgnb($\hat{u}_0 \oplus \hat{u}_1 \oplus \hat{u}_2 \oplus \hat{u}_3 \oplus \hat{u}_4 \oplus \hat{u}_5$)·llr0+sgnb($\hat{u}_2 \oplus \hat{u}_3$)·llr2+sgnb($\hat{u}_4 \oplus \hat{u}_5$)·llr4+llr6
temp2=sgnb($\hat{u}_1 \oplus \hat{u}_3 \oplus \hat{u}_5$)·llr1+sgnb($\hat{u}_3$)·llr3+sgnb($\hat{u}_5$)·llr5+llr7
llr6'=sgn(temp1)·sgn(temp2)·min(|temp1|,|temp2|)
A8_7 function:

$llr7' = \text{sgn}b(\hat{u}_0 \oplus \hat{u}_1 \oplus \hat{u}_2 \oplus \hat{u}_3 \oplus \hat{u}_4 \oplus \hat{u}_5 \oplus \hat{u}_6) \cdot llr0 +$ $\text{sgn}b(\hat{u}_1 \oplus \hat{u}_3 \oplus \hat{u}_5) \cdot llr1 + \text{sgn}b(\hat{u}_2 \oplus \hat{u}_3 \oplus \hat{u}_6) \cdot llr2 + \text{sgn}b(\hat{u}_3) \cdot llr3 +$ $\text{sgn}b(\hat{u}_4 \oplus \hat{u}_5 \oplus \hat{u}_6) \cdot llr4 + \text{sgn}b(\hat{u}_5) \cdot llr5 + \text{sgn}b(\hat{u}_6) \cdot llr6 + llr7$ where
$\hat{u}_x$ are estimated bit values;
llrx are input LLR values;
llrx' are output LLR values;

$$\text{sgn}(w) = \begin{cases} + & w \geq 0 \\ - & w < 0 \end{cases};$$

min( ) is minimum;

$$\text{sgn}b(b) = \begin{cases} + & b = 0 \\ - & b = 1 \end{cases};$$

and
$\oplus$ is XOR,
the LLR stages include an LLR stage with f and g nodes, which respectively apply the following functions or equivalent functions consistent therewith:
f-function: llr0'=sgn(llr0)·sgn(llr1)·min(|llr0|,|llr1|)
g-function: llr1'=llr1+sgnb($\hat{u}_0$)·llr0,
where
$\hat{u}_0$ is an estimated bit value;
llrx are input LLR values;
llrx' are output LLR values; and
min( ) is minimum;
the decoding involves List decoding.

The embodiments described with reference to FIGS. 12 and 13 relate to example methods. In another embodiment, a non-transitory processor-readable medium stores instructions which, when executed by one or more processors, cause the one or more processors to perform a method as disclosed herein. One such method involves receiving a word that is based on an N-bit codeword of a polar code, and decoding the received word using fewer than $\log_2 N$ LLR stages. A method implemented in the form of instructions stored on a non-transitory processor-readable medium could include any of the features listed above or otherwise disclosed herein.

Apparatus embodiments, for both encoding and decoding, are also contemplated.

Figure 14:
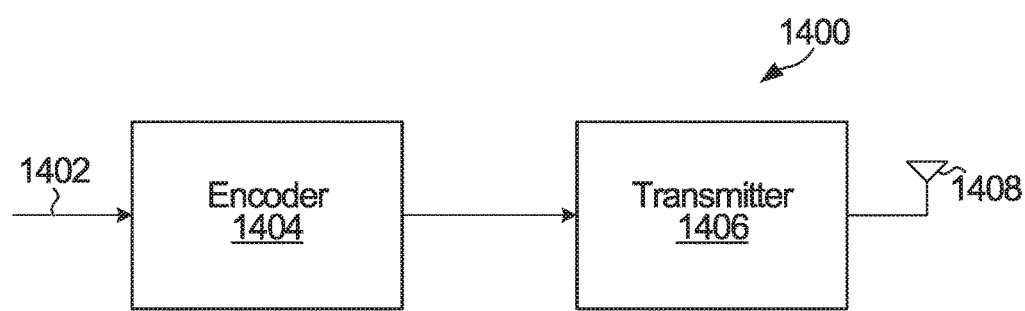
FIG. 14 is a block diagram of an example apparatus for encoding and transmitting codewords.

FIG. 14 is a block diagram of an example apparatus 1400 for encoding and transmitting codewords. The example apparatus 1400 includes an encoder 1404 coupled to a transmitter 1406. In the illustrated embodiment, the apparatus 1400 also includes an antenna 1408, coupled to the transmitter 1406, for transmitting signals over a wireless channel. In some embodiments, the transmitter 1406 includes a modulator, amplifier, and/or other components of a radio frequency (RF) transmit chain. The encoder 1404 receives input 1402 comprising symbols and is configured to apply polar encoding to encode the symbols into a codeword, which is provided to the transmitter 1406 for transmission via the antenna 1408.

Figure 15:
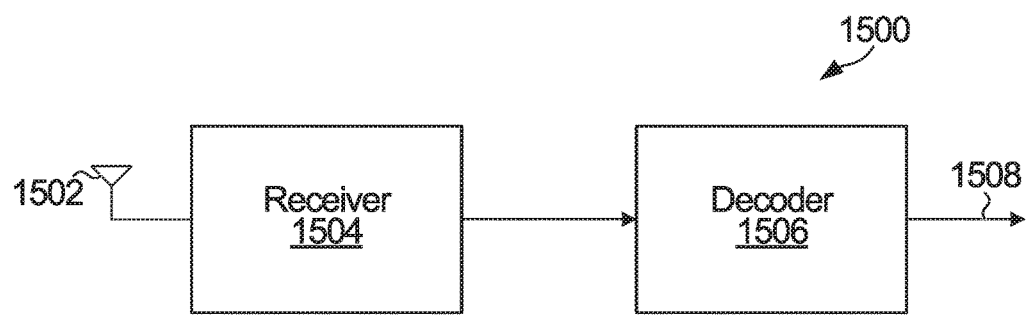
FIG. 15 is a block diagram of an apparatus for receiving and decoding codewords.

FIG. 15 is a block diagram of illustration of an apparatus 1500 for receiving and decoding codewords. The example apparatus 1500 comprises a receiver 1504 coupled to a decoder 1506. In the illustrated embodiment, the receiver 1504 has an antenna 1502 for receiving signals from a wireless channel. In some embodiments, the receiver 1504 includes a demodulator, amplifier, and/or other components of a radio frequency (RF) receive chain. The receiver 1504 receives via the antenna 1502 a signal carrying a word that is based on an N-bit codeword of a polar code. The received word is provided to the decoder 1506. The decoder 1506 is configured to implement a method described herein to decode the received word into an output that includes symbols and is provided as output 1508 from the decoder. The decoder 1506 decodes the received word in fewer than $\log_2 N$ LLR stages.

The apparatus 1400 and/or the apparatus 1500 could be implemented in user equipment or communication network equipment. Such equipment could include an encoder and transmitter, a receiver and a decoder, or all of these components if encode/transmit and receive/decode functions are to be supported.

In some embodiments, a non-transitory computer readable medium comprising instructions for execution by one or more processors may be provided to control operation of the encoder 1404 in FIG. 14, to control operation of the decoder 1506 in FIG. 15, and/or to otherwise control the execution of methods described herein. In some embodiments, a processor may be a component of a general-purpose computer hardware platform. In other embodiments, a processor may be a component of a special-purpose hardware platform. For example, a processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a compact disc read-only memory (CD-ROM), universal serial bus (USB) flash disk, or a removable hard disk.

Figure 16:
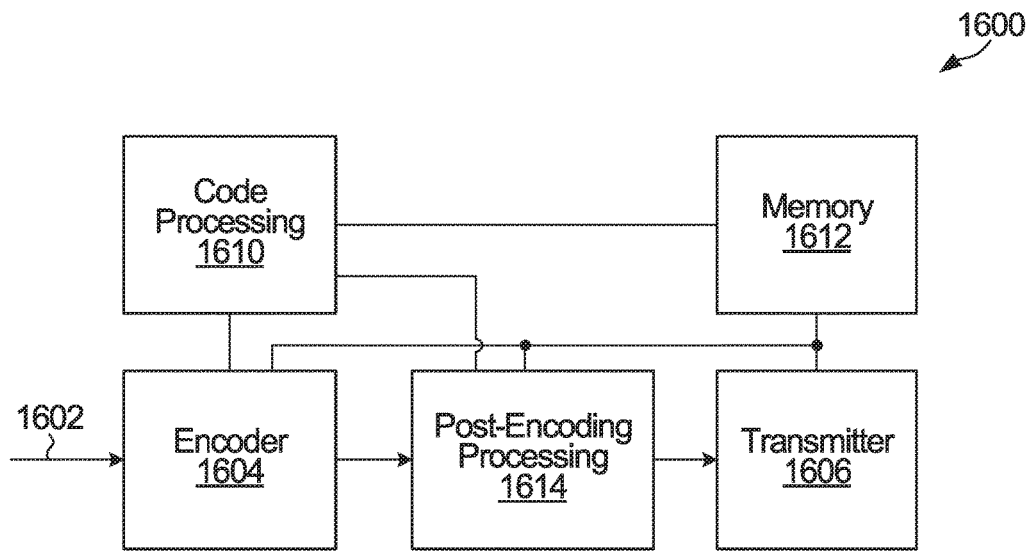
FIG. 16 is a block diagram of another apparatus for encoding and transmitting codewords.

FIG. 16 is a block diagram of another apparatus for encoding and transmitting codewords. The apparatus 1600 includes an encoder module 1604 coupled to an input 1602 and to a transmitter module 1606. The apparatus 1600 also includes a code processing module 1610 coupled to the encoder module 1604 and a post-encoding processing module 1614. The post-encoding processing module 1614 is also coupled to the encoder module 1604 and to the transmitter module 1606. A memory 1612, also shown in FIG. 16, is coupled to the encoder module 1604, to the code processing module 1610, to the post-encoding processing module 1614, and to the transmitter module 1606. Although not shown, the transmitter module 1606 could include a modulator, an amplifier, antenna and/or other modules or components of a transmit chain or alternatively could be configured to interface with a separate (Radio-Frequency—RF) transmission module. For example, some of all of the modules 1604, 1606, 1610, 1612, 1614 of the apparatus 1600 may be implemented in hardware or circuitry (e.g. in one or more chipsets, microprocessors, application-specific integrated circuits (ASIC), field-programmable gate arrays (FPGAs), dedicated logic circuitry, or combinations thereof) so as to produce codewords as described herein for transmission by a separate (RF) unit.

In some embodiments, the memory 1612 is a non-transitory computer readable medium at 1612, that includes instructions for execution by a processor to implement and/or control operation of the code processing module 1610, the encoder module 1604, the post-encoding processing module 1614, the transmitter module 1606 in FIG. 16, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a compact disc read-only memory (CD-ROM), universal serial bus (USB) flash disk, or a removable hard disk, at 1612.

In some embodiments, the encoder module 1604 is implemented in circuitry, such as a processor, that is configured to encode input bits. In a processor-based implementation of the encoder module 1604, processor-executable instructions to configure a processor to perform encoding operations are stored in a non-transitory processor-readable medium. The non-transitory medium could include, in the memory 1612 for example, one or more solid-state memory devices and/or memory devices with movable and possibly removable storage media.

The code processing module 1610 could be implemented in circuitry that is configured to determine coding parameters such as mother code block length, and to determine an ordered sub-channel sequence. In some embodiments, the code processing module 1610 is implemented using a processor. The same processor or other circuitry, or separate processors or circuitry, could be used to implement both the encoder module 1604 and the code processing module 1610. As noted above for the encoder module 1604, in a processor-based implementation of the code processing module 1610, processor-executable instructions to configure a processor to perform code processing operations are stored in a non-transitory processor-readable medium, in the memory 1612 for example.

Like the encoder module 1604 and the code processing module 1610, the post-encoding processing module 1614 is implemented in circuitry, such as a processor, that is configured to perform various post-encoding operations. These post-encoding operations could include rate-matching operations such as puncturing, shortening and/or interleaving, for example. In a processor-based implementation of the post-encoding processing module 1614, processor-executable instructions to configure a processor to perform post-encoding operations are stored in a non-transitory processor-readable medium, examples of which are described above. In an embodiment, the post-encoding processing module 1614 derives a puncturing or shortening scheme from a puncturing or shortening scheme that is to be applied to a codeword prior to transmission. Information indicative of bit positions and/or sub-channels that are affected by post-encoding operations, or information from which such bit positions or sub-channels may be determined, may be fed back to the code processing module 1610, stored to the memory 1612, or otherwise made available to the code processing module 1610 by the post-encoding processing module 1614.

In some embodiments of the code processing module 1610, the coding parameters and/or the ordered sub-channel sequence may be determined based on information from the post-encoding processing module 1614. For instance, the ordered sub-channel sequence may be determined based on the rate-matching scheme determined by the post-encoding processing module 1614. Conversely, in some other embodiments, the post-encoding processing module 1614 may determine a rate-matching scheme based on the coding parameters and/or the ordered sub-channel sequence determined by the code processing module 1610. In yet some other embodiments, the determinations made within the code processing module 1610 and post-encoding processing module 1614 are jointly performed and optimized.

The apparatus 1600 could implement any of various other features that are disclosed herein. For example, the encoder module 1604, the transmitter module 1606, the code processing module 1610, and/or the post-encoding processing module 1614 could be configured to implement any one or more of the encoding features listed or otherwise described herein.

In some alternative embodiments, the functionality of the encoder module 1604, the transmitter module 1606, the code processing module 1610, and/or the post-encoding processing module 1614 described herein may be fully or partially implemented in hardware or alternatively in software, for example in modules stored in a memory such as 1612 and executed by one or more processors of the apparatus 1600.

An apparatus could therefore include a processor, and a memory such as 1612, coupled to the processor, storing instructions which, when executed by the processor, cause the processor to perform the functionality and/or embodiments described in relation to the encoder module 1604, the transmitter module 1606, the code processing module 1610, and/or the post-encoding module 1614 described herein.

Figure 17:
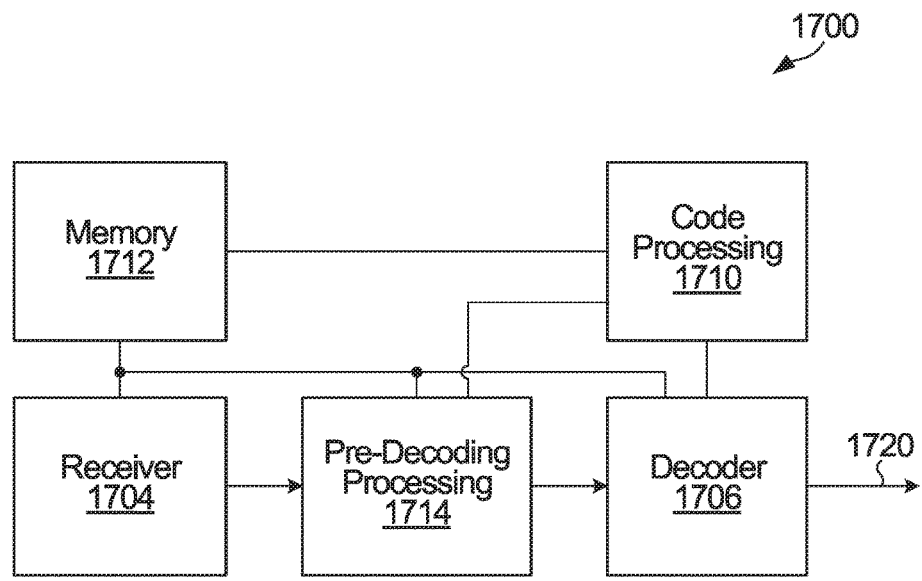
FIG. 17 is a block diagram of another example apparatus for receiving and decoding codewords.

FIG. 17 is a block diagram of an example apparatus for receiving and decoding codewords. The apparatus 1700 includes a receiver module 1704 which is configured to receive signals transmitted wirelessly and which is coupled to a decoder module 1706. The apparatus 1700 also includes a code processing module 1710 coupled to the decoder module 1706 and a pre-decoding processing module 1714. The pre-decoding processing module 1714 is also coupled to the decoder module 1706 and to the receiver module 1704. A memory 1712 also shown in FIG. 17, is coupled to the decoder module 1706, to the code processing module 1710, to the receiver module 1704, and to the pre-decoding processing module 1714.

Although not shown, the receiver module 1704 could include an antenna, demodulator, amplifier, and/or other modules or components of a receive chain or alternatively could be configured to interface with a separate (Radio-Frequency—RF) receiving module. For example, some of all of the modules 1704, 1706, 1710, 1712, 1714 of the apparatus 1700 may be implemented in hardware or circuitry (e.g. in one or more chipsets, microprocessors, ASICs. FPGAs, dedicated logic circuitry, or combinations thereof) so as to receive a word based on a codeword of a polar code as described herein. Decoded bits are output at 1720 for further receiver processing.

In some embodiments, the memory 1712 is a non-transitory computer readable medium that includes instructions for execution by a processor to implement and/or control operation of the receiver module 1704, decoder module 1706, the code processing module 1710, and the pre-decoding processing module 1714 in FIG. 17, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a CD-ROM, USB flash disk, or a removable hard disk, at 1712.

The decoder module 1706 is implemented in circuitry, such as a processor, that is configured to decode received codewords as disclosed herein. In a processor-based implementation of the decoder module 1706, processor-executable instructions to configure a processor to perform decoding operations are stored in a non-transitory processor-readable medium. The non-transitory medium could include, in the memory 1712 for example, one or more solid-state memory devices and/or memory devices with movable and possibly removable storage media.

The code processing module 1710 is implemented in circuitry that is configured to determine (and store to the memory 1712) ordered sub-channel sequences. In a processor-based implementation of the code-processing module 1710, processor-executable instructions to configure a processor to perform code-processing operations are stored in a non-transitory processor-readable medium, examples of which are described above. Information representing ordered sub-channel sequences, and/or the selected sub-channels could be provided to the decoder module 1706 by the code processing module 1710 for use in decoding received words, and/or stored in the memory 1712 by the code processing module 1710 for subsequent use by the decoder module 1706.

Like the decoder module 1706 and the code processing module 1710, the pre-decoding processing module 1714 is implemented in circuitry, such as a processor, that is configured to perform pre-decoding operations. These operations could include receiver/decoder-side rate matching operations also known as de-rate-matching operations, such as de-puncturing and/or de-shortening to reverse puncturing/shortening that was applied at an encoder/transmitter side, for example. In a processor-based implementation of the pre-decoding processing module 1714, processor-executable instructions to configure a processor to perform pre-decoding processing operations are stored in a non-transitory processor-readable medium, examples of which are described above. In an embodiment, the pre-decoding processing module 1714 derives a puncturing or shortening scheme from a puncturing or shortening scheme that is to be applied to a received codeword. Information indicative of bit positions and/or sub-channels that are affected by pre-decoding processing, or information from which such bit positions or sub-channels may be determined, may be fed back to the code processing module 1710, stored to the memory 1712, or otherwise made available to the code processing module 1710 by the pre-decoding processing module 1714.

In some embodiments of the code processing module 1710, the ordered sub-channel sequence may be determined based on information from the pre-decoding processing module 1714. For instance, the ordered sub-channel sequence may be determined based on the rate-matching scheme determined by the pre-decoding processing module 1714. Conversely, in some other embodiments, the pre-decoding processing module 1714 may determine a rate-matching scheme based on the coding parameters and/or the ordered sub-channel sequence determined by the code processing module 1710. In yet some other embodiments, the determinations made within the code processing module 1710 and pre-decoding processing module 1714 are jointly performed and optimized.

In some alternative embodiments, the functionality of the receiver module 1704, the decoder module 1706, the code processing module 1710, and/or the pre-decoding processing module 1714 described herein may be fully or partially implemented in software or modules, for example in receiving and decoding modules stored in a memory 1712 and executed by one or more processors of the apparatus 1700.

An apparatus could therefore include a processor, and a memory such as 1712, coupled to the processor, storing instructions which, when executed by the processor, cause the processor to perform the functionality and/or embodiments disclosed herein, or receiving/decoding operations corresponding to transmitting encoding operations disclosed herein.

The apparatus 1700 could implement any of various other features that are disclosed herein. For example, the decoder module 1706, the receiver module 1704, the code processing module 1710, and/or the pre-decoding processing module 1714 could be configured to implement any one or more of receiving/decoding features corresponding to encoding/transmitting features noted above.

In an embodiment, an apparatus includes a receiver such as 1504, 1704 for receiving a word that is based on an N-bit codeword of a polar code, and a decoder such as 1506, 1706, coupled to the receiver, to decode the received word in fewer than $\log_2 N$ LLR stages. A decoder could be implemented using a processor, examples of which are provided herein, configured to decode the received word.

Variations of apparatus implementations could be or become apparent to a skilled person based on the present disclosure. For example, any one or more of the following could be provided, alone or in any of various combinations, in embodiments:

the LLR stages include a higher-order LLR stage with nodes implementing functions based on a combination of lower-order polar code kernels;

the lower-order polar code kernels are 2-by-2 polar code kernels;

the functions include one or more of the following A, B, C, and D functions or equivalent functions consistent therewith:

A-function: $llr0' = sgn(llr0) \cdot sgn(llr1) \cdot sgn(llr2) \cdot sgn(llr3) \cdot \min(|llr0|, |llr1|, |llr2|, |llr3|)$ B-function:
$llr1' = sgn(llr1) \cdot sgn(llr3) \cdot \min(|llr1|, |llr3|) + sgnb(\hat{u}_0) sgn(llr0) \cdot sgn(llr2) \cdot \min(|llr0|, |llr2|)$, or equivalently

| $\hat{u}_0$ | llr1' |
|---|---|
| 0 | sgn(llr1) * sgn(llr3) * min{|llr1|, |llr3|} + sgn(llr0) * sgn(llr2) * min{|llr0|, |llr2|} |
| 1 | sgn(llr1) * sgn(llr3) * min{|llr1|, |llr3|} − sgn(llr0) * sgn(llr2) * min{|llr0|, |llr2|} |

C-function:
$llr2' = sgnb(\hat{u}_0 \oplus \hat{u}_1) \cdot llr0 + llr2) * sgn(sgnb(\hat{u}_1) \cdot llr1 + llr3) * \min\{|sgnb(\hat{u}_0 \oplus \hat{u}_1) \cdot llr0 + llr2|, |sgnb(\hat{u}_1) \cdot llr1 + llr3|\}$ or equivalently

| $\hat{u}_0$ | $\hat{u}_1$ | llr2' |
|---|---|---|
| 0 | 0 | sgn(llr0 + llr2) * sgn(llr1 + llr3) * min{|llr0 + llr2|, |llr1 + llr3|} |
| 0 | 1 | sgn(−llr0 + llr2) * sgn(−llr1 + llr3) * min{|−llr0 + llr2|, |−llr1 + llr3|} |
| 1 | 0 | sgn(−llr0 + llr2) * sgn(llr1 + llr3) * min{|−llr0 + llr2|, |llr1 + llr3|} |
| 1 | 1 | sgn(llr0 + llr2) * sgn(−llr1 + llr3) * min{|llr0 + llr2|, |−llr1 + llr3|} |

D-function: $llr3' = sgnb(\hat{u}_0 \oplus \hat{u}_1 \oplus \hat{u}_2) \cdot llr0 + sgn(\hat{u}_1) \cdot llr1 + sgnb(\hat{u}_2) \cdot llr2 + llr3$, or equivalently

| $\hat{u}_0$ | $\hat{u}_1$ | $\hat{u}_2$ | llr3' |
|---|---|---|---|
| 0 | 0 | 0 | llr0 + llr1 + llr2 + llr3 |
| 0 | 0 | 1 | −llr0 + llr1 − llr2 + llr3 |
| 0 | 1 | 0 | −llr0 − llr1 + llr2 + llr3 |
| 0 | 1 | 1 | llr0 − llr1 − llr2 + llr3 |
| 1 | 0 | 0 | −llr0 + llr1 + llr2 + llr3 |
| 1 | 0 | 1 | llr0 + llr1 − llr2 + llr3 |
| 1 | 1 | 0 | llr0 − llr1 + llr2 + llr3 |
| 1 | 1 | 1 | −llr0 − llr1 − llr2 + llr3 | where
$\hat{u}_x$ are estimated bit values;
llrx are input LLR values;
llrx' are output LLR values;

$$sgn(w) = \begin{cases} + & w \geq 0 \\ - & w < 0 \end{cases};$$

min( ) is minimum;

$$sgnb(b) = \begin{cases} + & b = 0 \\ - & b = 1 \end{cases};$$

and
$\oplus$ is XOR;

the functions include one or more of the following A8 functions or equivalent functions consistent therewith:

A8_0 function:

llr0'=sgn(llr0)*sgn(llr1)*sgn(llr2)*sgn(llr3)*sgn(llr4)*
sgn(llr5)*sgn(llr6)*sgn 7)*min{|llr0|,|llr1|,|llr2|,|llr3|,
|llr4|,|llr5|,|llr6|,|llr7|}

A8_1 function:

llr1'=sgnb($\hat{u}_0$)*sgn(llr0)*sgn(llr2)*sgn(llr4)*sgn(llr6)*
min{|llr0|,|llr2|,|llr4|,|llr6|}+sgn(llr1)*sgn(llr3)*sgn
(llr5)*sgn(llr7)*min{|llr1|,|llr3|,|llr5|,|llr7|}

A8_2 function:

temp1=sgnb($\hat{u}_0 \oplus \hat{u}_1$)·[sgn(llr0)·sgn(llr4)·min(|llr4|)]+sgn
(llr2)·sgn(llr6)·min(|llr2|,|llr6|)

temp2=sgnb($\hat{u}_1$)·[sgn(llr1)·sgn(llr5)·min(|llr5|)]+sgn(llr3)·
sgn(llr7)·min(|llr3|,|llr7|)

llr2'=sgn(temp1)·sgn(temp2)·min(|temp1|,|temp2|)

A8_3 function:

$ll3' = \text{sgn}b(\hat{u}_0 \oplus \hat{u}_1 \oplus \hat{u}_2) \cdot \text{sgn}(llr0) \cdot \text{sgn}(llr4) \cdot \min(|llr0|, |llr4|) +$ $\text{sgn}b(\hat{u}_2) \cdot \text{sgn}(llr2) \cdot \text{sgn}(llr6) \cdot \min(|llr2|, |llr6|) +$ $\text{sgn}b(\hat{u}_1) \cdot \text{sgn}(llr1) \cdot \text{sgn}(llr5) \cdot \min(|llr1|, |llr5|) +$ $\text{sgn}(llr3) \cdot \text{sgn}(llr7) \cdot \min(|llr3|, |llr7|)$ A8_4 function:

temp1=sgnb($\hat{u}_0 \oplus \hat{u}_1 \oplus \hat{u}_2 \oplus \hat{u}_3$)·llr0+llr4 temp2=sgnb($\hat{u}_1 \oplus \hat{u}_3$)·llr1+llr5 temp3=sgnb($\hat{u}_2 \oplus \hat{u}_3$)·llr2+llr6 temp4=sgnb($\hat{u}_3$)·llr3+llr7 llr4'=sgn(temp1)·sgn(temp2)·sgn(temp3)·sgn(temp4)·min
(|temp1|,|temp2|,|temp3|,|temp4|)

A8_5 function:

temp1=sgnb($\hat{u}_0 \oplus \hat{u}_1 \oplus \hat{u}_2 \oplus \hat{u}_3$)·llr0+llr4 temp2=sgnb($\hat{u}_1 \oplus \hat{u}_3$)·llr1+llr5 temp3=sgnb($\hat{u}_2 \oplus \hat{u}_3$)·llr2+llr6 temp4=sgnb($\hat{u}_3$)·llr3+llr7 llr5'=sgnb($\hat{u}_4$)·[sgn(temp1)·sgn(temp3)·min{|temp1|,
|temp3|}]+[sgn(temp2)·sgn(temp4)·min{|temp2|,
|temp4|}]

A8_6 function:

temp1=sgnb($\hat{u}_0 \oplus \hat{u}_1 \oplus \hat{u}_2 \oplus \hat{u}_3 \oplus \hat{u}_4 \oplus \hat{u}_5$)·llr0+sgnb($\hat{u}_2 \oplus \hat{u}_3$)·
llr2+sgnb($\hat{u}_4 \oplus \hat{u}_5$)·llr4+llr6 temp2=sgnb($\hat{u}_1 \oplus \hat{u}_3 \oplus \hat{u}_5$)·llr1+sgnb($\hat{u}_3$)·llr3+sgnb($\hat{u}_5$)·llr5+
llr7 llr6'=sgn(temp1)·sgn(temp2)·min(|temp1|,|temp2|)

A8_7 function:

$llr7' = \text{sgn}b(\hat{u}_0 \oplus \hat{u}_1 \oplus \hat{u}_2 \oplus \hat{u}_3 \oplus \hat{u}_4 \oplus \hat{u}_5 \oplus \hat{u}_6) \cdot llr0 +$ $\text{sgn}b(\hat{u}_1 \oplus \hat{u}_3 \oplus \hat{u}_5) \cdot llr1 + \text{sgn}b(\hat{u}_2 \oplus \hat{u}_3 \oplus \hat{u}_6) \cdot llr2 + \text{sgn}b(\hat{u}_3) \cdot llr3 +$ $\text{sgn}b(\hat{u}_4 \oplus \hat{u}_5 \oplus \hat{u}_6) \cdot llr4 + \text{sgn}b(\hat{u}_5) \cdot llr5 + \text{sgn}b(\hat{u}_6) \cdot llr6 + llr7$ where $\hat{u}_x$ are estimated bit values;

llrx are input LLR values;

llrx' are output LLR values;

$$\text{sgn}(w) = \begin{cases} + & w \geq 0 \\ - & w < 0 \end{cases};$$

min( ) is minimum;

$$\text{sgn}b(b) = \begin{cases} + & b = 0 \\ - & b = 1 \end{cases};$$

and $\oplus$ is XOR;

the LLR stages include an LLR stage with f and g nodes, which respectively apply the following functions or equivalent functions consistent therewith:

f-function: llr0'=sgn(llr0)·sgn(llr1)·min(|llr0|,|llr1|)

g-function: llr1'=llr1+sgnb($\hat{u}_0$)·llr0, where $\hat{u}_0$ is an estimated bit value;

llrx are input LLR values;

llrx' are output LLR values; and min( ) is minimum;

the decoder includes a List decoder.

Apparatus as disclosed herein could be implemented, for example, in user equipment, communication network equipment, or both. In some embodiments, apparatus may be implemented using one or more processors and a non-transitory computer readable medium that stores instructions for execution by the one or more processors.

Figure 18:
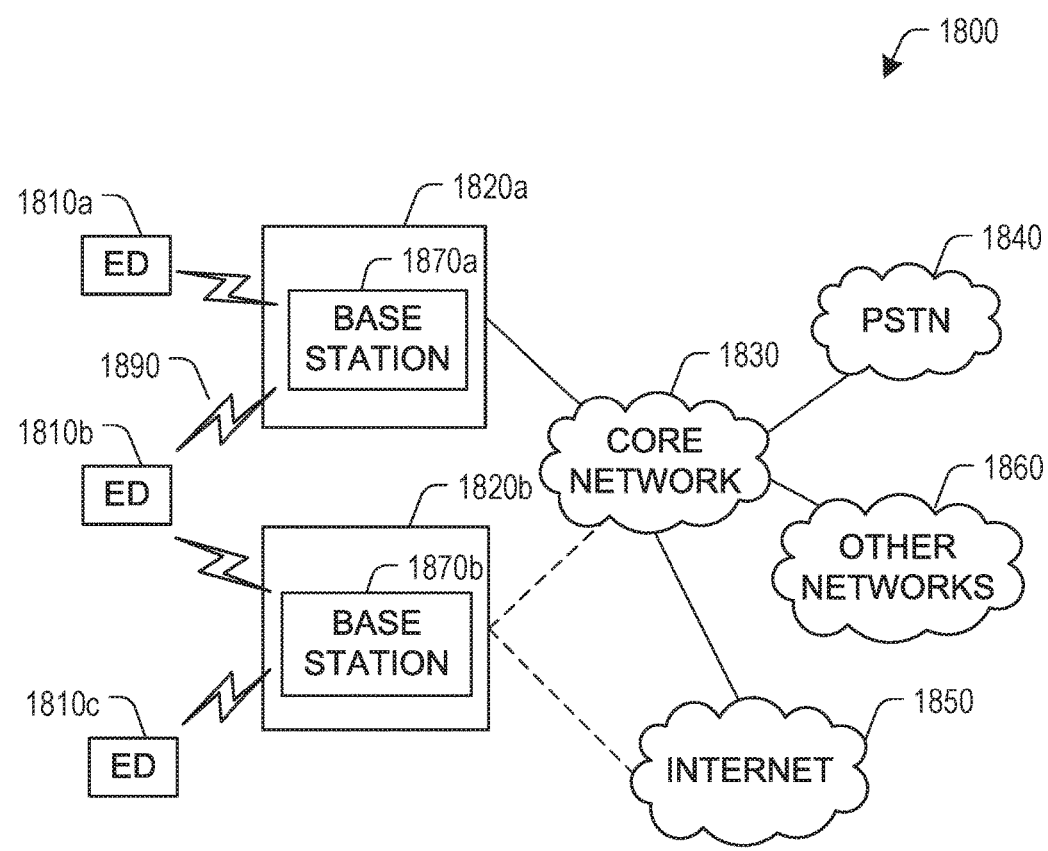
FIG. 18 is a block diagram of an example communication system in which embodiments disclosed herein may be used.

FIG. 18 illustrates an example communication system 1800 in which embodiments of the present disclosure could be implemented. In general, the communication system 100 enables multiple wireless or wired elements to communicate data and other content. The purpose of the communication system 1800 may be to provide content (voice, data, video, text) via broadcast, narrowcast, user device to user device, etc. The communication system 1800 may operate by sharing resources such as bandwidth.

In this example, the communication system 1800 includes electronic devices (ED) 1810a-1810c, radio access networks (RANs) 1820a-1820b, a core network 1830, a public switched telephone network (PSTN) 1840, the internet 1850, and other networks 1860. Although certain numbers of these components or elements are shown in FIG. 18, any reasonable number of these components or elements may be included.

The EDs 1810a-1810c and base stations 1870a-1870b are examples of communication equipment that can be configured to implement some or all of the functionality and/or embodiments described herein. For example, any one of the EDs 1810a-1810c and base stations 1870a-1870b could be configured to implement the encoding or decoding functionality (or both) described above. In another example, any one of the EDs 1810a-1810c and base stations 1870a-1870b could include the apparatus 1600, the apparatus 1700 or both described above in relation to FIGS. 16 and 17.

The EDs 1810a-1810c are configured to operate, communicate, or both, in the communication system 1800. For example, the EDs 1810a-1810c are configured to transmit, receive, or both via wireless or wired communication channels. Each ED 1810a-1810c represents any suitable end user device for wireless operation and may include such devices (or may be referred to) as a user equipment/device (UE), wireless transmit/receive unit (WTRU), mobile station, fixed or mobile subscriber unit, cellular telephone, station (STA), machine type communication (MTC) device personal digital assistant (FDA), smartphone, laptop, computer, tablet, wireless sensor, or consumer electronics device.

In FIG. 18, the RANs 1820*a*-1820*b* include base stations 1870*a*-1870*b*, respectively. Each base station 1870*a*-1870*b* is configured to wirelessly interface with one or more of the EDs 1810*a*-1810*c* to enable access to any other base station 1870*a*-1870*b*, the core network 1830, the PSTN 1840, the Internet 1850, and/or the other networks 1860. For example, the base stations 1870*a*-1870*b* may include (or be) one or more of several well-known devices, such as a base transceiver station (BTS), a Node-B (NodeB), an evolved NodeB (eNodeB), a Home eNodeB, a gNodeB, a transmission point (TP), a site controller, an access point (AP), or a wireless router. Any ED 1810*a*-1810*c* may be alternatively or additionally configured to interface, access, or communicate with any other base station 1870*a*-1870*b*, the internet 1850, the core network 1830, the PSTN 1840, the other networks 1860, or any combination of the preceding. The communication system 1800 may include RANs, such as RAN 1820*b*, wherein the corresponding base station 1870*b* accesses the core network 1830 via the internet 1850, as shown.

The EDs 1810*a*-1810*c* and base stations 1870*a*-1870*b* are examples of communication equipment that can be configured to implement some or all of the functionality and/or embodiments described herein. In the embodiment shown in FIG. 18, the base station 1870*a* forms part of the RAN 1820*a*, which may include other base stations, base station controller(s) (BSC), radio network controller(s) (RNC), relay nodes, elements, and/or devices. Any base station 1870*a*, 1870*b* may be a single element, as shown, or multiple elements, distributed in the corresponding RAN, or otherwise. Also, the base station 1870*b* forms part of the RAN 1820*b*, which may include other base stations, elements, and/or devices. Each base station 1870*a*-1870*b* transmits and/or receives wireless signals within a particular geographic region or area, sometimes referred to as a "tell" Or "coverage area". A cell may be further divided into cell sectors, and a base station 1870*a*-1870*b* may, for example, employ multiple transceivers to provide service to multiple sectors. In some embodiments, there may be established pica or femto cells where the radio access technology supports such. In some embodiments, multiple transceivers could be used for each cell, for example using multiple-input multiple-output (MIMO) technology. The number of RAN 1820*a*-1820*b* shown is exemplary only. Any number of RAN may be contemplated when devising the communication system 1800.

The base stations 1870*a*-1870*b* communicate with one or more of the EDs 1810*a*-1810*c* over one or more air interfaces 1890 using wireless communication links e.g. radio frequency (RF), microwave, infrared (IR), etc. The air interfaces 1890 may utilize any suitable radio access technology. For example, the communication system 1800 may implement one or more channel access methods, such as code division multiple access (CDMA), time division multiple access (TDMA), frequency division multiple access (FDMA), orthogonal FDMA (OFDMA), or single-carrier FDMA (SC-FDMA) in the air interfaces 1890.

A base station 1870*a*-1870*b* may implement Universal Mobile Telecommunication System (UMTS) Terrestrial Radio Access (UTRA) to establish an air interface 1890 using wideband COMA (WCDMA). In doing so, the base station 1870*a*-1870*b* may implement protocols such as HSPA, HSPA+ optionally including HSDPA, HSUPA or both. Alternatively, a base station 1870*a*-1870*b* may establish an air interface 1890 with Evolved UTMS Terrestrial Radio Access (E-UTRA) using LTE, LTE-A, and/or LTE-B. It is contemplated that the communication system 1800 may use multiple channel access functionality, including such schemes as described above. Other radio technologies for implementing air interfaces include IEEE 802.11, 802.15, 802.16, CDMA2000, CDMA2000 1×, CDMA2000 EV-DO, IS-2000, IS-95, IS-856, GSM, EDGE, and GERAN. Of course, other multiple access schemes and wireless protocols may be utilized.

The RANs 1820*a*-1820*b* are in communication with the core network 1830 to provide the EDs 1810*a*-1810*c* with various services such as voice, data, and other services. The RANs 1820*a*-1820*b* and/or the core network 1830 may be in direct or indirect communication with one or more other RANs (not shown), which may or may not be directly served by core network 1830, and may or may not employ the same radio access technology as RAN 1820*a*, RAN 1820*b* or both. The core network 1830 may also serve as a gateway access between (i) the RANs 1820*a*-1820*b* or EDs 1810*a*-1810*c* or both, and (ii) other networks (such as the PSTN 1840, the internet 1850, and the other networks 1860). In addition, some or all of the EDs 1810*a*-1810*c* may include functionality for communicating with different wireless networks over different wireless links using different wireless technologies and/or protocols. Instead of wireless communication (or in addition thereto), the EDs 1810*a*-1810*c* may communicate via wired communication channels to a service provider or switch (not shown), and to the internet 1850. PSTN 1840 may include circuit switched telephone networks for providing plain old telephone service (POTS). Internet 1850 may include a network of computers and subnets (intranets) or both, and incorporate protocols, such as IP, TCP, UDP. EDs 1810*a*-1810*c* may be multimode devices capable of operation according to multiple radio access technologies, and incorporate multiple transceivers necessary to support such.

Figure 19A:
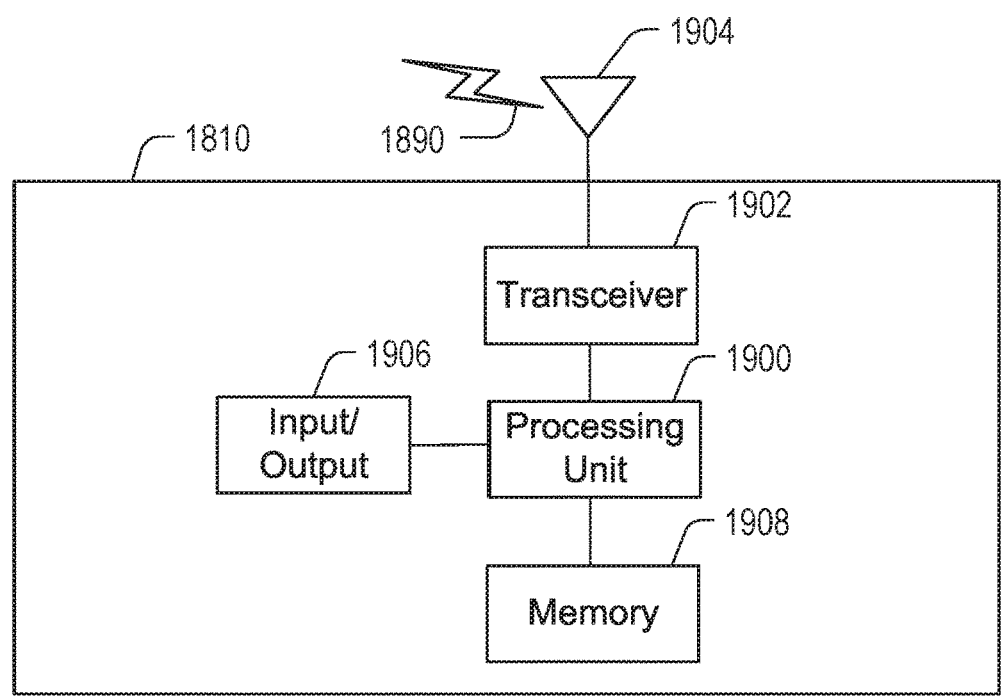
FIGS. 19A-B are block diagrams of an example Electronic Device (ED) and an example base station which may implement embodiments disclosed herein.
Figure 19B:
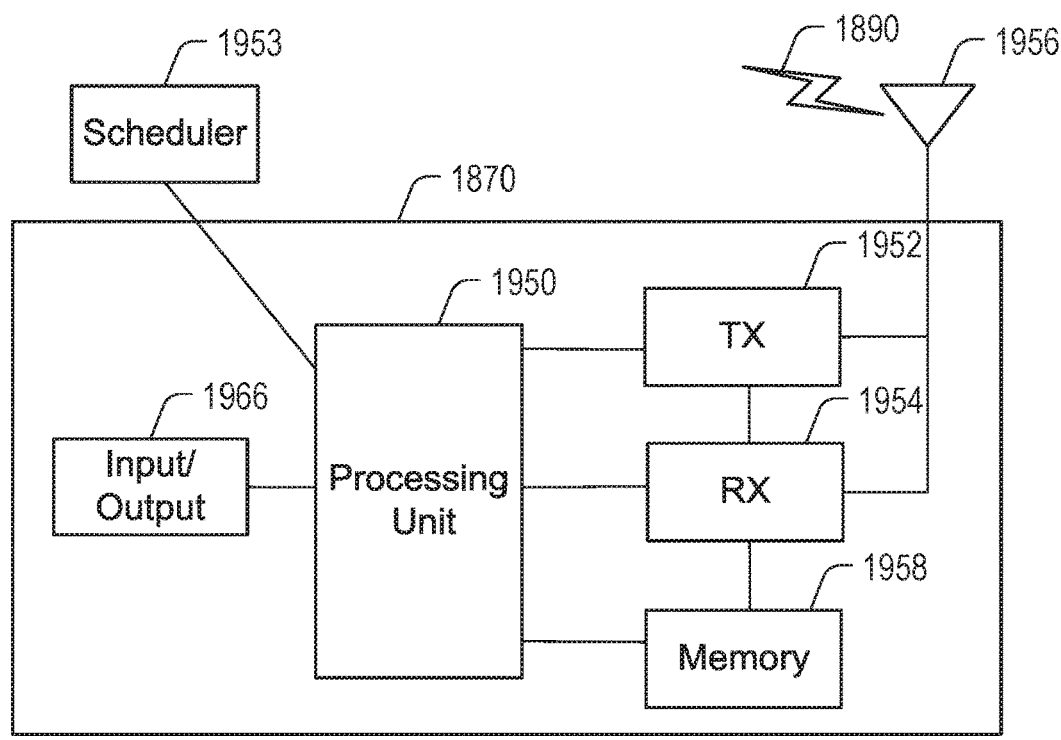

FIGS. 19A and 19B illustrate example devices that may implement the methods and teachings according to this disclosure. In particular, FIG. 19A illustrates an example ED 1810, and FIG. 19B illustrates an example base station 1870. These components could be used in the communication system 1800 or in any other suitable system.

As shown in FIG. 19A, the ED 1810 includes at least one processing unit 1900. The processing unit 1900 implements various processing operations of the ED 1810. For example, the processing unit 1900 could perform signal coding, data processing, power control, input/output processing, or any other functionality enabling the ED 1810 to operate in the communication system 1800. The processing unit 1900 may also be configured to implement some or all of the functionality and/or embodiments described in more detail above. Each processing unit 1900 includes any suitable processing or computing device configured to perform one or more operations. Each processing unit 1900 could, for example, include a microprocessor, microcontroller, digital signal processor, field programmable gate array, or application specific integrated circuit.

The ED 1810 also includes at least one transceiver 1902. The transceiver 1902 is configured to modulate data or other content for transmission by at least one antenna or Network Interface Controller (NIC) 1904. The transceiver 1902 is also configured to demodulate data or other content received by the at least one antenna 1904. Each transceiver 1902 includes any suitable structure for generating signals for wireless or wired transmission and/or processing signals received wirelessly or by wire. Each antenna 1904 includes any suitable structure for transmitting and/or receiving wireless or wired signals. One or multiple transceivers 1902 could be used in the ED 1810, and one or multiple antennas 1904 could be used in the ED 1810. Although shown as a single functional unit, a transceiver 1902 could also be implemented using at least one transmitter and at least one separate receiver.

The ED 1810 further includes one or more input/output devices 1906 or interfaces (such as a wired interface to the internet 1850). The input/output devices 1906 permit interaction with a user or other devices in the network. Each input/output device 1906 includes any suitable structure for providing information to or receiving information from a user, such as a speaker, microphone, keypad, keyboard, display, or touch screen, including network interface communications.

In addition, the ED 1810 includes at least one memory 1908. The memory 1908 stores instructions and data used, generated, or collected by the ED 1810. For example, the memory 1908 could store software instructions or modules configured to implement some or all of the functionality and/or embodiments described above and that are executed by the processing unit(s) 1900. Each memory 1908 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

As shown in FIG. 19B, the base station 1870 includes at least one processing unit 1950, at least one transmitter 1952, at least one receiver 1954, one or more antennas 1956, at least one memory 1958, and one or more input/output devices or interfaces 1966. A transceiver, not shown, may be used instead of the transmitter 1952 and receiver 1954. A scheduler 1953 may be coupled to the processing unit 1950. The scheduler 1953 may be included within or operated separately from the base station 1870. The processing unit 1950 implements various processing operations of the base station 1870, such as signal coding, data processing, power control, input/output processing, or any other functionality. The processing unit 1950 can also be configured to implement some or all of the functionality and/or embodiments described in more detail above. Each processing unit 1950 includes any suitable processing or computing device configured to perform one or more operations. Each processing unit 1950 could, for example, include a microprocessor, microcontroller, digital signal processor, field programmable gate array, or application specific integrated circuit.

Each transmitter 1952 includes any suitable structure for generating signals for wireless or wired transmission to one or more EDs or other devices. Each receiver 1954 includes any suitable structure for processing signals received wirelessly or by wire from one or more EDs or other devices. Although shown as separate components, at least one transmitter 1952 and at least one receiver 1954 could be combined into a transceiver. Each antenna 1956 includes any suitable structure for transmitting and/or receiving wireless or wired signals. Although a common antenna 1956 is shown here as being coupled to both the transmitter 1952 and the receiver 1954, one or more antennas 1956 could be coupled to the transmitter(s) 1952, and one or more separate antennas 1956 could be coupled to the receiver(s) 1954. Each memory 1958 includes any suitable volatile and/or non-volatile storage and retrieval device(s) such as those described above in connection to the ED 1810. The memory 1958 stores instructions and data used, generated, or collected by the base station 1870. For example, the memory 1958 could store software instructions or modules configured to implement some or all of the functionality and/or embodiments described above and that are executed by the processing unit(s) 1950.

Each input/output device 1966 permits interaction with a user or other devices in the network. Each input/output device 1966 includes any suitable structure for providing information to or receiving/providing information from a user, including network interface communications.

The previous description of some embodiments is provided to enable any person skilled in the art to make or use an apparatus, method, or processor readable medium according to the present disclosure.

Various modifications to these embodiments will be readily apparent to those skilled in the art, and the generic principles of the methods and devices described herein may be applied to other embodiments. Thus, the present disclosure is not intended to be limited to the embodiments shown herein but is to be accorded the widest scope consistent with the principles and novel features disclosed herein.

For example, although embodiments are described primarily with reference to bits, other embodiments may involve non-binary and/or multi-bit symbols. If one sub-channel can transmit more than one bit, then several bits can be combined into a symbol in a defined alphabet, and a non-binary symbol is encoded for each sub-channel. Accordingly, polarization kernels are not limited to binary kernels. Symbol-level (Galois field) or non-binary kernels are also contemplated. A non-binary kernel could be preferred for its higher degree of polarization than a binary kernel. However, decoding computation complexity is higher for a non-binary kernel, because a decoder would handle multi-bit symbols rather than bits.

Non-binary kernels possess characteristics of binary kernels. Furthermore, non-binary kernels could be combined or cascaded with binary kernels to form one polar code. Although the Arikan 2-by-2 binary kernel is used herein as an example, disclosed features may be extended to other types of polarization kernels.

The present disclosure refers primarily to a 2-by-2 kernel as example to demonstrate and explain illustrative embodiments. However, it is understood that the techniques for selecting sub-channels as disclosed herein could be applied to other types of polarization kernels as well, such as non-two prime number dimension kernels, non-primary dimension kernels, and/or higher dimension kernels formed by a combination of different (primary or non-primary) dimensions of kernels.

As noted above, polar codes have been selected for uplink and downlink eMBB control channel coding for the new 5G air interface, also known as 5G new radio (NR). The techniques disclosed herein could be used not only for control data over a control channel but also or instead other types of data (e.g. user data) over any type of channel (e.g. a data channel).

We claim:
1. A method comprising:
receiving from a transmitter, over a physical channel, a word that is based on an N-bit codeword of a polar code;
decoding the received word using Successive Cancellation (SC) decoding and fewer than $\log_2 N$ Log Likelihood Ratio (LLR) stages, the LLR stages comprising an LLR stage including nodes that implement functions combining more than two inputs, the inputs to each node comprising LLR values, or LLR values and a partial sum of previously decoded bits of the received word; and outputting decoded bits, from decoding the received word, for further processing, wherein the decoding using SC decoding and fewer than $\log_2 N$ LLR stages provides reduced latency and reduced memory space requirements relative to decoding using SC decoding and $\log_2 N$ LLR stages.

2. The method of claim 1, wherein the LLR stage including nodes that each implement functions combining more than two inputs comprises a higher-order LLR stage with the nodes implementing the functions based on a combination of lower-order polar code kernels.

3. The method of claim 2, wherein the lower-order polar code kernels are 2-by-2 polar code kernels.

4. The method of claim 3, wherein the functions comprise one or more of the following A, B, C, and D functions or equivalent functions consistent therewith:

A-function: $llr0'=\text{sgn}(llr0)\cdot\text{sgn}(llr1)\cdot\text{sgn}(llr2)\cdot\text{sgn}(llr3)\cdot \min(|llr0|,|llr1|,|llr2|,|llr3|)$ B-function:
$llr1'=(llr1)\cdot\text{sgn}(llr3)\cdot\min(|llr1|,|llr3|)+\text{sgnb}(\hat{u}_0)\text{sgn}(llr0)\cdot \text{sgn}(llr2)\cdot\min(|llr0|,|llr2|)$, or equivalently

| $\hat{u}_0$ | llr1' |
|---|---|
| 0 | sgn(llr1) * sgn(llr3) * min{|llr1|, |llr3|} + sgn(llr0) * sgn(llr2) * min{|llr0|, |llr2|} |
| 1 | sgn(llr1) * sgn(llr3) * min{|llr1|, |llr3|} − sgn(llr0) * sgn(llr2) * min{|llr0|, |llr2|} |

C-function:
$llr2'=\text{sgn}(\text{sgnb}(\hat{u}_0\oplus\hat{u}_1)\cdot llr0+llr2)*\text{sgn}(\text{sgnb}(\hat{u}_1)\cdot llr1+llr3*\min\{|\text{sgnb}(\hat{u}_0\oplus\hat{u}_1)\cdot llr0+llr2|,|\text{sgnb}(\hat{u}_1)\cdot llr1+llr3|\}$
or equivalently

| $\hat{u}_0$ | $\hat{u}_1$ | llr2' |
|---|---|---|
| 0 | 0 | sgn(llr0 + llr2) * sgn(llr1 + llr3) * min{|llr0 + llr2|, |llr1 + llr3|} |
| 0 | 1 | sgn(−llr0 + llr2) * sgn(−llr1 + llr3) * min{|−llr0 + llr2|, |−llr1 + llr3|} |
| 1 | 0 | sgn(−llr0 + llr2) * sgn(llr1 + llr3) * min{|−llr0 + llr2|, |llr1 + llr3|} |
| 1 | 1 | sgn(llr0 + llr2) * sgn(−llr1 + llr3) * min{|llr0 + llr2|, |−llr1 + llr3|} |

D-function: $llr3'=\text{sgnb}(\hat{u}_0\oplus\hat{u}_1\oplus\hat{u}_2)\cdot llr0+\text{sgnb}(\hat{u}_1)\cdot llr1+\text{sgnb}(\hat{u}_2)\cdot llr2+llr3$, or equivalently

| $\hat{u}_0$ | $\hat{u}_1$ | $\hat{u}_2$ | llr3' |
|---|---|---|---|
| 0 | 0 | 0 | llr0 + llr1 + llr2 + llr3 |
| 0 | 0 | 1 | −llr0 + llr1 − llr2 + llr3 |
| 0 | 1 | 0 | −llr0 − llr1 + llr2 + llr3 |
| 0 | 1 | 1 | llr0 − llr1 − llr2 + llr3 |
| 1 | 0 | 0 | −llr0 + llr1 + llr2 + llr3 |
| 1 | 0 | 1 | llr0 + llr1 − llr2 + llr3 |
| 1 | 1 | 0 | llr0 − llr1 + llr2 + llr3 |
| 1 | 1 | 1 | −llr0 − llr1 − llr2 + llr3 | where $\hat{u}_x$ are estimated bit values;

llrx are input LLR values;

llrx' are output LLR values;

$$\text{sgn}(w) = \begin{cases} + & w \geq 0 \\ - & w < 0 \end{cases};$$

min( ) is minimum;

$$\text{sgnb}(b) = \begin{cases} + & b = 0 \\ - & b = 1 \end{cases};$$

and $\oplus$ is XOR.

5. The method of claim 2, wherein the functions comprise one or more of the following A8 functions or equivalent functions consistent therewith:

A8_0 function:
$llr0'=\text{sgn}(llr0)*\text{sgn}(llr1)*\text{sgn}(llr2)*\text{sgn}(llr3)*\text{sgn}(llr4)*\text{sgn}(llr5)*\text{sgn}(llr6)*\text{sgn}(llr7)*\min\{|llr0|,|llr1|,|llr2|,|llr3|,|llr4|,|llr5|,|llr6|,|llr7|\}$ A8_1 function:
$llr1'=\text{sgnb}(\hat{u}_0)*\text{sgn}(llr0)*\text{sgn}(llr2)*\text{sgn}(llr4)*\text{sgn}(llr6)*\min\{|llr0|,|llr2|,|llr4|,|llr6|\}+\text{sgn}(llr1)*\text{sgn}(llr3)*\text{sgn}(llr5)*\text{sgn}(llr7)*\min\{|llr1|,|llr3|,|llr7|\}$ A8_2 function:
$temp1=\text{sgnb}(\hat{u}_0\oplus\hat{u}_1)\cdot[\text{sgn}(llr0)\cdot\text{sgn}(llr4)\cdot\min(|llr0|,|llr4|)]+\text{sgn}(llr2)\cdot\text{sgn}(llr6)\cdot\min(|llr2|,|llr6|)$ $temp2=\text{sgnb}(\hat{u}_1)\cdot[\text{sgn}(llr1)\cdot\text{sgn}(llr5)\cdot\min(|llr1|,|llr5|)]+\text{sgn}(llr3)\cdot\text{sgn}(llr7)\cdot\min(|llr3|,|llr7|)$ $llr2'=\text{sgn}(temp1)\cdot\text{sgn}(temp2)\cdot\min(|temp1|,|temp2|)$ A8_3 function:

$$llr3' = \text{sgnb}(\hat{u}_0 \oplus \hat{u}_1 \oplus \hat{u}_2)\cdot\text{sgn}(llr0)\cdot\text{sgn}(llr4)\cdot\min(|llr0|,|llr4|) +$$
$$\text{sgnb}(\hat{u}_2)\cdot\text{sgn}(llr2)\cdot\text{sgn}(llr6)\cdot\min(|llr2|,|llr6|) +$$
$$\text{sgnb}(\hat{u}_1)\cdot\text{sgn}(llr1)\cdot\text{sgn}(llr5)\cdot\min(|llr1|,|llr5|) +$$
$$\text{sgn}(llr3)\cdot\text{sgn}(llr7)\cdot\min(|llr3|,|llr7|)$$

A8_4 function:
$temp1=\text{sgnb}(\hat{u}_0\oplus\hat{u}_1\oplus\hat{u}_2\oplus\hat{u}_3)\cdot llr0+llr4$
$temp2=\text{sgnb}(\hat{u}_1\oplus\hat{u}_3)\cdot llr1+llr5$
$temp3=\text{sgnb}(\hat{u}_2\oplus\hat{u}_3)\cdot llr2+llr6$
$temp4=\text{sgnb}(\hat{u}_3)\cdot llr3+llr7$
$llr4'=\text{sgn}(temp1)\cdot\text{sgn}(temp2)\cdot\text{sgn}(temp3)\cdot\text{sgn}(temp4)\cdot\min(|temp1|,|temp2|,|temp3|,|temp4|)$ A8_5 function:
$temp1=\text{sgnb}(\hat{u}_0\oplus\hat{u}_1\oplus\hat{u}_2\oplus\hat{u}_3)\cdot llr0+llr4$
$temp2=\text{sgnb}(\hat{u}_1\oplus\hat{u}_3)\cdot llr1+llr5$
$temp3=\text{sgnb}(\hat{u}_2\oplus\hat{u}_3)\cdot llr2+llr6$
$temp4=\text{sgnb}(\hat{u}_3)\cdot llr3+llr7$
$llr5'=\text{sgnb}(\hat{u}_4)\cdot[\text{sgn}(temp1)\cdot\text{sgn}(temp3)\cdot\min\{|temp1|,|temp3|\}]+[\text{sgn}(temp2)\cdot\text{sgn}(temp4)\cdot\min\{|temp2|,|temp4|\}]$ A8_6 function:
$temp1=\text{sgnb}(\hat{u}_0\oplus\hat{u}_1\oplus\hat{u}_2\oplus\hat{u}_3\oplus\hat{u}_4\oplus\hat{u}_5)\cdot llr0+\text{sgnb}(\hat{u}_2\oplus\hat{u}_3)\cdot llr2+\text{sgnb}(\hat{u}_4\oplus\hat{u}_5)\cdot llr4+llr6$
$temp2=\text{sgnb}(\hat{u}_1\oplus\hat{u}_3\oplus\hat{u}_5)\cdot llr1+\text{sgnb}(\hat{u}_3)\cdot llr3+\text{sgnb}(\hat{u}_5)\cdot llr5+llr7$
$llr6'=\text{sgn}(temp1)\cdot\text{sgn}(temp2)\cdot\min(|temp1|,|temp2|)$ A8_7 function:

$$llr7' = \text{sgn}b(\hat{u}_0 \oplus \hat{u}_1 \oplus \hat{u}_2 \oplus \hat{u}_3 \oplus \hat{u}_4 \oplus \hat{u}_5 \oplus \hat{u}_6) \cdot llr0 +$$
$$\text{sgn}b(\hat{u}_1 \oplus \hat{u}_3 \oplus \hat{u}_5) \cdot llr1 + \text{sgn}b(\hat{u}_2 \oplus \hat{u}_3 \oplus \hat{u}_6) \cdot llr2 + \text{sgn}b(\hat{u}_3) \cdot llr3 +$$
$$\text{sgn}b(\hat{u}_4 \oplus \hat{u}_5 \oplus \hat{u}_6) \cdot llr4 + \text{sgn}b(\hat{u}_5) \cdot llr5 + \text{sgn}b(\hat{u}_6) \cdot llr6 + llr7$$

where
  $\hat{u}_x$ are estimated bit values;
  llrx are input LLR values;
  llrx' are output LLR values;

$$\text{sgn}(w) = \begin{cases} + & w \geq 0 \\ - & w < 0 \end{cases};$$

min( ) is minimum;

$$\text{sgn}b(b) = \begin{cases} + & b = 0 \\ - & b = 1 \end{cases};$$

and
$\oplus$ is XOR.

6. The method of claim 1, wherein the LLR stages further comprise an LLR stage with f and g nodes, which respectively apply the following functions or equivalent functions consistent therewith:
  f-function: llr0'=sgn(llr0)·sgn(llr1)·min(|llr0|,|llr1|)
  g-function: llr1'=llr1+sgnb($\hat{u}_0$)·llr0,
  where
    $\hat{u}_0$ is an estimated bit value;
    llrx are input LLR values;
    llrx' are output LLR values; and
    min( ) is minimum.

7. The method of claim 1, wherein the decoding comprises List decoding.

8. An apparatus comprising:
  a receiver for receiving from a transmitter, over a physical channel, a word that is based on an N-bit codeword of a polar code; and
  a decoder, coupled to the receiver, to decode the received word using Successive Cancellation (SC) decoding and fewer than $\log_2 N$ Log Likelihood Ratio (LLR) stages, the LLR stages comprising an LLR stage including nodes that implement functions combining more than two inputs, the inputs to each node comprising LLR values, or LLR values and a partial sum of previously decoded bits of the received word, and to output decoded bits, from decoding the received word, for further processing,
  wherein decoding using SC decoding and fewer than $\log_2 N$ LLR stages provides reduced latency and reduced memory space requirements relative to decoding using SC decoding and $\log_2 N$ LLR stages.

9. The apparatus of claim 8, wherein the LLR stage including nodes that each implement functions combining more than two inputs comprises a higher-order LLR stage with the nodes implementing the functions based on a combination of lower-order polar code kernels.

10. The apparatus of claim 8, wherein the lower-order polar code kernels are 2-by-2 polar code kernels.

11. The apparatus of claim 10, wherein the functions comprise one or more of the following A, B, C, and D functions or equivalent functions consistent therewith:
  A-function: llr0'=sgn(llr0)·sgn(llr1)·sgn(llr2)·sgn(llr3)·min(|llr0|,|llr1|,|llr2|,|llr3|)
  B-function:
  llr1'=sgn(llr1)·sgn(llr3)·min(|llr1|,|llr3|)+sgnb($\hat{u}_0$)sgn(llr0)·sgn(llr2)·min(|llr0|,|llr2|), or equivalently

| $\hat{u}_0$ | llr1' |
|---|---|
| 0 | sgn(llr1) * sgn(llr3) * min{|llr1|, |llr3|} + sgn(llr0) * sgn(llr2) * min{|llr0|, |llr2|} |
| 1 | sgn(llr1) * sgn(llr3) * min{|llr1|, |llr3|} − sgn(llr0) * sgn(llr2) * min{|llr0|, |llr2|} |

C-function:
  llr2'=sgn(sgnb($\hat{u}_0 \oplus \hat{u}_1$)·llr0+llr2)*sgn(sgnb($\hat{u}_1$)·llr1+llr3)* min{|sgnb($\hat{u}_0 \oplus \hat{u}_1$)·llr0+llr2|,|sgnb($\hat{u}_1$)·llr1+llr3|} or equivalently

| $\hat{u}_0$ | $\hat{u}_1$ | llr2' |
|---|---|---|
| 0 | 0 | sgn(llr0 + llr2) * sgn(llr1 + llr3) * min{|llr0 + llr2|, |llr1 + llr3|} |
| 0 | 1 | sgn(−llr0 + llr2) * sgn(−llr1 + llr3) * min{|−llr0 + llr2|, |−llr1 + llr3|} |
| 1 | 0 | sgn(−llr0 + llr2) * sgn(llr1 + llr3) * min{|−llr0 + llr2|, |llr1 + llr3|} |
| 1 | 1 | sgn(llr0 + llr2) * sgn(−llr1 + llr3) * min{|llr0 + llr2|, |−llr1 + llr3|} |

D-function: llr3'=sgnb($\hat{u}_0 \oplus \hat{u}_1 \oplus \hat{u}_2$)·llr0+sgnb($\hat{u}_1$)·llr1+sgnb($\hat{u}_2$)·llr2+llr3, or equivalently

| $\hat{u}_0$ | $\hat{u}_1$ | $\hat{u}_2$ | llr3' |
|---|---|---|---|
| 0 | 0 | 0 | llr0 + llr1 + llr2 + llr3 |
| 0 | 0 | 1 | −llr0 + llr1 − llr2 + llr3 |
| 0 | 1 | 0 | −llr0 − llr1 + llr2 + llr3 |
| 0 | 1 | 1 | llr0 − llr1 − llr2 + llr3 |
| 1 | 0 | 0 | −llr0 + llr1 + llr2 + llr3 |
| 1 | 0 | 1 | llr0 + llr1 − llr2 + llr3 |
| 1 | 1 | 0 | llr0 − llr1 + llr2 + llr3 |
| 1 | 1 | 1 | −llr0 − llr1 − llr2 + llr3 | where
  $\hat{u}_x$ are estimated bit values;
  llrx are input LLR values;
  llrx' are output LLR values;

$$\text{sgn}(w) = \begin{cases} + & w \geq 0 \\ - & w < 0 \end{cases};$$

min( ) is minimum;

$$\text{sgn}b(b) = \begin{cases} + & b = 0 \\ - & b = 1 \end{cases};$$

and
$\oplus$ is XOR.

12. The apparatus of claim 9, wherein the functions comprise one or more of the following A8 functions or equivalent functions consistent therewith:

A8_0 function:
llr0'=sgn(llr0)*sgn(llr1)*sgn(llr2)*sgn(llr3)*sgn(llr4)*
   sgn(llr5)*sgn(llr6)*sgn(llr7)*min{|llr0|,|llr1|,|llr2|,
   |llr3|,|llr4|,|llr5|,|llr6|,|llr7|}
A8_1 function:
llr1'=sgnb($\hat{u}_0$)*sgn(llr0)*sgn(llr2)*sgn(llr4)*sgn(llr6)*
   min{|llr0|,|llr2|,|llr4|,|llr6|}+sgn(llr1)*sgn(llr3)*sgn
   (llr5)*sgn(llr7)*min{|llr1|,|llr3|,|llr7|}
A8_2 function:
temp1=sgnb($\hat{u}_0 \oplus \hat{u}_1$)·[sgn(llr0)·sgn(llr4)·min(|llr0|,
   |llr4|)]+sgn(llr2)·sgn(llr6)·min(|llr2|,|llr6|)
temp2=sgnb($\hat{u}_1$)·[sgn(llr1)·sgn(llr5)·min(|llr1|,|llr5|)]+
   sgn(llr3)·sgn(llr7)·min(|llr3|,|llr7|)
llr2'=sgn(temp1)·sgn(temp2)·min(|temp1|,|temp2|)
A8_3 function:

$$llr3' = \mathrm{sgn}b(\hat{u}_0 \oplus \hat{u}_1 \oplus \hat{u}_2) \cdot \mathrm{sgn}(llr0) \cdot \mathrm{sgn}(llr4) \cdot \min(|llr0|, |llr4|) +$$
$$\mathrm{sgn}b(\hat{u}_2) \cdot \mathrm{sgn}(llr2) \cdot \mathrm{sgn}(llr6) \cdot \min(|llr2|, |llr6|) +$$
$$\mathrm{sgn}b(\hat{u}_1) \cdot \mathrm{sgn}(llr1) \cdot \mathrm{sgn}(llr5) \cdot \min(|llr1|, |llr5|) +$$
$$\mathrm{sgn}(llr3) \cdot \mathrm{sgn}(llr7) \cdot \min(|llr3|, |llr7|)$$

A8_4 function:
temp1=sgnb($\hat{u}_0 \oplus \hat{u}_1 \oplus \hat{u}_2 \oplus \hat{u}_3$)·llr0+llr4
temp2=sgnb($\hat{u}_1 \oplus \hat{u}_3$)·llr1+llr5
temp3=sgnb($\hat{u}_2 \oplus \hat{u}_3$)·llr2+llr6
temp4=sgnb($\hat{u}_3$)·llr3+llr7
llr4'=sgn(temp1)·sgn(temp2)·sgn(temp3)·sgn(temp4)·min
   (|temp1|,|temp2|,|temp3|,|temp4|)
A8_5 function:
temp1=sgnb($\hat{u}_0 \oplus \hat{u}_1 \oplus \hat{u}_2 \oplus \hat{u}_3$)·llr0+llr4
temp2=sgnb($\hat{u}_1 \oplus \hat{u}_3$)·llr1+llr5
temp3=sgnb($\hat{u}_2 \oplus \hat{u}_3$)·llr2+llr6
temp4=sgnb($\hat{u}_3$)·llr3+llr7
llr5'=sgnb($\hat{u}_4$)·[sgn(temp1)·sgn(temp3)·min{|temp1|,
   |temp3|}]+[sgn(temp2)·sgn(temp4)·min{|temp2|,
   |temp4|}]
A8_6 function:
temp1=sgnb($\hat{u}_0 \oplus \hat{u}_1 \oplus \hat{u}_2 \oplus \hat{u}_3 \oplus \hat{u}_4 \oplus \hat{u}_5$)·llr0+sgnb($\hat{u}_2 \oplus \hat{u}_3$)·
   llr2+sgnb($\hat{u}_4 \oplus \hat{u}_5$)·llr4+llr6
temp2=sgnb($\hat{u}_1 \oplus \hat{u}_3 \oplus \hat{u}_5$)·llr1+sgnb($\hat{u}_3$)·llr3+sgnb($\hat{u}_5$)·
   llr5+llr7
llr6'=sgn(temp1)·sgn(temp2)·min(|temp1|,|temp2|)

A8_7 function:

$$llr7' = \mathrm{sgn}b(\hat{u}_0 \oplus \hat{u}_1 \oplus \hat{u}_2 \oplus \hat{u}_3 \oplus \hat{u}_4 \oplus \hat{u}_5 \oplus \hat{u}_6) \cdot llr0 +$$
$$\mathrm{sgn}b(\hat{u}_1 \oplus \hat{u}_3 \oplus \hat{u}_5) \cdot llr1 + \mathrm{sgn}b(\hat{u}_2 \oplus \hat{u}_3 \oplus \hat{u}_6) \cdot llr2 + \mathrm{sgn}b(\hat{u}_3) \cdot llr3 +$$
$$\mathrm{sgn}b(\hat{u}_4 \oplus \hat{u}_5 \oplus \hat{u}_6) \cdot llr4 + \mathrm{sgn}b(\hat{u}_5) \cdot llr5 + \mathrm{sgn}b(\hat{u}_6) \cdot llr6 + llr7$$

where
  $\hat{u}_x$ are estimated bit values;
  llrx are input LLR values;
  llrx' are output LLR values;

$$\mathrm{sgn}(w) = \begin{cases} + & w \geq 0 \\ - & w < 0 \end{cases};$$

min( ) is minimum;

$$\mathrm{sgn}b(b) = \begin{cases} + & b = 0 \\ - & b = 1 \end{cases};$$

and
⊕ is XOR.

13. The apparatus of claim 8, wherein the LLR stages further comprise an LLR stage with f and g nodes, which respectively apply the following functions or equivalent functions consistent therewith:
  f-function: llr0'=sgn(llr0)·sgn(llr1)·min(|llr0|,|llr1|)
  g-function: llr1'=llr1+sgnb($\hat{u}_0$)·llr0,
  where
    $\hat{u}_0$ is an estimated bit value;
    llrx are input LLR values;
    llrx' are output LLR values; and
    min( ) is minimum.

14. The apparatus of claim 8, wherein the decoder comprises a List decoder.

15. User equipment comprising the apparatus of claim 8.

16. Communication network equipment comprising the apparatus of claim 8.

* * * * *